(12) United States Patent
Chen et al.

(10) Patent No.: US 11,933,924 B2
(45) Date of Patent: Mar. 19, 2024

(54) ACTIVE PIXEL SENSOR AND FLAT PANEL DETECTOR

(71) Applicant: BOE TECHNOLOGY GROUP CO., LTD., Beijing (CN)

(72) Inventors: Jiangbo Chen, Beijing (CN); Fanli Meng, Beijing (CN); Zeyuan Li, Beijing (CN); Yao Lu, Beijing (CN); Tuo Sun, Beijing (CN); Yanzhao Li, Beijing (CN); Ding Ding, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 248 days.

(21) Appl. No.: 17/488,259

(22) Filed: Sep. 28, 2021

(65) Prior Publication Data

US 2022/0229194 A1 Jul. 21, 2022

(30) Foreign Application Priority Data

Jan. 20, 2021 (CN) .......................... 202110074856.3

(51) Int. Cl.
*G01T 1/20* (2006.01)
*H01L 27/146* (2006.01)
*H04N 5/32* (2023.01)
*H04N 25/75* (2023.01)

(52) U.S. Cl.
CPC .... *G01T 1/20184* (2020.05); *H01L 27/14676* (2013.01); *H04N 5/32* (2013.01); *H04N 25/75* (2023.01)

(58) Field of Classification Search
None
See application file for complete search history.

(56) References Cited

U.S. PATENT DOCUMENTS

| | | | |
|---|---|---|---|
| 5,084,801 A * | 1/1992 | El-Hamamsy | H01G 7/06 361/277 |
| 9,099,230 B2 * | 8/2015 | Cowell, III | H01L 28/20 |
| 11,201,188 B2 * | 12/2021 | Palaniappan | H04N 23/76 |
| 2016/0337567 A1 * | 11/2016 | Okura | H01L 27/14645 |
| 2019/0379340 A1 * | 12/2019 | Rattan | H03G 3/001 |

* cited by examiner

*Primary Examiner* — Edwin C Gunberg
(74) *Attorney, Agent, or Firm* — HOUTTEMAN LAW LLC

(57) ABSTRACT

The present disclosure provides an active pixel sensor and a flat panel detector. The active pixel sensor includes: a light sensing device configured to convert light sensed by the light sensing device into charges and supply the charges to a floating diffusion node; an amplification sub-circuit configured to amplify a signal according to a potential at the floating diffusion node and output the amplified signal through the output terminal; an adjustment sub-circuit configured to adjust, in response to a first control signal, a conversion gain from an amount of the light sensed by the light sensing device to the potential at the floating diffusion node; and a read sub-circuit configured to transmit a voltage of the input terminal of the read sub-circuit to the output terminal of the read sub-circuit according to a scan signal provided by the scan line.

7 Claims, 10 Drawing Sheets

| Cst (pF) | MSM dark current(A) | MSM photocurrent(A) | 1st row of pixels: dark current (μA) | 1st row of pixels: photocurrent (μA) | 512th row of pixels: dark current (μA) | 512th row of pixels: photocurrent (μA) |
|---|---|---|---|---|---|---|
| 0.022 | 1.00E-13 | 2.00E-11 | 0.60624 | 1.5339 | 0.63888 | 1.5709 |
| 0.1 | 1.00E-13 | 2.00E-11 | 1.3007 | 2.2033 | 1.346 | 2.2241 |
| 0.2 | 1.00E-13 | 2.00E-11 | 1.9871 | 2.6167 | 2.0145 | 2.6303 |
| 0.3 | 1.00E-13 | 2.00E-11 | 2.2606 | 2.8323 | 2.2809 | 2.8383 |
| 0.4 | 1.00E-13 | 2.00E-11 | 2.5003 | 2.9604 | 2.5121 | 2.9672 |
| 0.5 | 1.00E-13 | 2.00E-11 | 2.6607 | 3.0488 | 2.6712 | 3.0531 |

ACTIVE PIXEL SENSOR AND FLAT PANEL DETECTOR

CROSS-REFERENCE TO RELATED APPLICATION

The present disclosure claims priority from Chinese Patent Application No. 202110074856.3, filed on Jan. 20, 2021 to China National Intellectual Property Administration, the contents of which are incorporated herein by reference in the entirety.

TECHNICAL FIELD

The present disclosure belongs to the field of biological chip technology, and particularly relates to an active pixel sensor and a flat panel detector.

BACKGROUND

A flat panel detector is a device for indirectly-digitalized X-ray imaging, which has a basic structure including an X-ray conversion layer and a plurality of passive pixel sensors or active pixel sensors arranged in an array under the X-ray conversion layer, and is capable of converting optical signals into electric signals and read out the electric signals. Due to its high signal-to-noise ratio, the active pixel sensor has been widely applied to flat panel detectors. The active pixel sensor includes a light sensing device and a reading circuit of the light sensing device. The X-ray conversion layer converts X rays attenuated after penetrating through a human body into visible light, the visible light is sensed by the light sensing device and converted into an electric signal, and then the electric signal is read out by the reading circuit and transmitted to a computer for image processing so as to carry out X-ray digital photography.

In the aspects of medical flat panel detectors, industrial detectors, low dose detection and the like, the intensity of signals read out by a reading circuit is obviously reduced due to the fact that detected pixels become small or the dose is reduced, and the signal-to-noise ratio is degraded.

SUMMARY

In a first aspect, embodiments of the present disclosure provide an active pixel sensor, including: a light sensing device configured to convert light sensed by the light sensing device into charges and supply the charges to a floating diffusion node; an amplification sub-circuit having an input terminal coupled to the floating diffusion node, a bias terminal coupled to a first power supply voltage terminal for supplying a first power supply voltage, and an output terminal, and configured to amplify a signal according to a potential at the floating diffusion node and output the amplified signal through the output terminal; an adjustment sub-circuit configured to adjust, in response to a first control signal, a conversion gain from an amount of the light sensed by the light sensing device to the potential at the floating diffusion node; and a read sub-circuit having a control terminal coupled to a scan line, an input terminal coupled to the output terminal of the amplification sub-circuit, and an output terminal, and configured to transmit a voltage of the input terminal of the read sub-circuit to the output terminal of the read sub-circuit according to a scan signal provided by the scan line.

In some examples, the adjustment sub-circuit has a control terminal coupled to a first control signal terminal for providing the first control signal, a first terminal coupled to the floating diffusion node, and a second terminal coupled to a second power supply voltage terminal, and is configured to change a capacitance value between the first terminal of the adjustment sub-circuit and the second terminal of the adjustment sub-circuit in response to the first control signal, such that the conversion gain from the amount of the light sensed by the light sensing device to the potential at the floating diffusion node is changed.

In some examples, the amplification sub-circuit includes a follower transistor having a control electrode coupled to the floating diffusion node, a first electrode coupled to the first power supply voltage terminal, and a second electrode coupled to the output terminal of the amplification sub-circuit, and the read sub-circuit includes a read transistor having a control electrode coupled to the scan line, a first electrode coupled to the output terminal of the amplification sub-circuit, and a second electrode coupled to the output terminal of the read sub-circuit.

In some examples, the adjustment sub-circuit includes a first capacitor, a second capacitor and a switching transistor; a first electrode of the first capacitor is coupled to the second power supply voltage terminal, and a second electrode of the first capacitor is coupled to the floating diffusion node; a first electrode of the second capacitor is coupled to a second electrode of the switching transistor, and a second electrode of the second capacitor is coupled to the second electrode of the first capacitor; and a control electrode of the switching transistor is coupled to the first control signal terminal, and a first electrode of the switching transistor is coupled to the second power supply voltage terminal.

In some examples, the adjustment sub-circuit includes a voltage-controlled liquid crystal capacitor having a first electrode, a liquid crystal layer on a side of the first electrode, and second and third electrodes, arranged side by side and spaced apart from each other, on a side of the liquid crystal layer away from the first electrode. The first electrode of the voltage-controlled liquid crystal capacitor is coupled to the floating diffusion node, the second electrode of the voltage-controlled liquid crystal capacitor is coupled to the second power supply voltage terminal, and the third electrode of the voltage-controlled liquid crystal capacitor is coupled to the first control signal terminal.

In some examples, the adjustment sub-circuit includes a varactor diode having a first electrode coupled to the floating diffusion node, a second electrode coupled to the second power supply voltage terminal, and a control electrode coupled to the first control signal terminal, and a capacitance between the first and second electrodes of the varactor diode varies according to a voltage of the control electrode of the varactor diode.

In some examples, the varactor diode is one of a PIN diode and a PN diode. The PIN diode has a first electrode, a semiconductor structure on a side of the first electrode, and second and third electrodes, arranged side by side and spaced apart from each other, on a side of the semiconductor structure away from the first electrode, the first electrode of the PIN diode is coupled to the floating diffusion node, the second electrode of the PIN diode is coupled to the second power supply voltage terminal, and the third electrode of the PIN diode is coupled to the first control signal terminal; and the PN diode has a first electrode, a semiconductor structure on a side of the first electrode, and second and third electrodes, arranged side by side and spaced apart from each other, on a side of the semiconductor structure away from the first electrode, the first electrode of the PN diode is coupled to the floating diffusion node, the second electrode of the PN diode is coupled to the second power supply voltage terminal, and the third electrode of the PN diode is coupled to the first control signal terminal.

In some examples, the adjustment sub-circuit is an amorphous metal nonlinear resistor (AMNR) having a first electrode, an insulating layer on a side of the first electrode, and second and third electrodes arranged side by side and spaced apart from each other on a side of the insulating layer away from the first electrode. The first electrode of the AMNR is coupled to the floating diffusion node, the second electrode of the AMNR is coupled to the second power supply voltage terminal, and the third electrode of the AMNR is coupled to the first control signal terminal.

In some examples, the adjustment sub-circuit includes an adjustment transistor having a first electrode coupled to the second power supply voltage terminal, a second electrode coupled to the floating diffusion node, and a control electrode coupled to the first control signal terminal.

In some examples, the active pixel sensor further includes: a reset transistor having a control electrode coupled to a reset signal terminal for providing a reset control signal, a first electrode coupled to an initialization signal terminal for providing an initialization signal, and a second electrode coupled to the floating diffusion node.

In a second aspect, embodiments of the present disclosure further provide a flat panel detector including a plurality of active pixel sensors.

In some examples, the flat panel detector further includes: a substrate on which the plurality of active pixel sensors are arranged in an array; and an X-ray conversion layer on a side of the plurality of active pixel sensors away from the substrate.

In some examples, the amplification sub-circuit includes a follower transistor having a control electrode coupled to the floating diffusion node, a first electrode coupled to the first power supply voltage terminal, and a second electrode coupled to the output terminal of the amplification sub-circuit, and the read sub-circuit includes a read transistor having a control electrode coupled to the scan line, a first electrode coupled to the output terminal of the amplification sub-circuit, and a second electrode coupled to the output terminal of the read sub-circuit. The flat panel detector further includes: an active semiconductor layer, a gate insulating layer and a first conductive layer sequentially stacked on the substrate, the active semiconductor layer including active layers of the follower transistor and the read transistor of each active pixel sensor, the first conductive layer including control electrodes of the follower transistor and the read transistor; a first insulating layer on the substrate and covering the active semiconductor layer, the gate insulating layer, and the first conductive layer; a second conductive layer on a side of the first insulating layer away from the substrate and including first and second electrodes of the follower transistor and the read transistor; and a planarization layer on a side of the second conductive layer away from the substrate. The light sensing devices of the plurality of active pixel sensors are on a side of the planarization layer away from the substrate.

In some examples, the adjustment sub-circuit of the active pixel sensor includes a first capacitor, a second capacitor, and a switching transistor, a first electrode of the first capacitor is coupled to the second power supply voltage terminal, a second electrode of the first capacitor is coupled to the floating diffusion node, a first electrode of the second capacitor is coupled to a second electrode of the switching transistor, a second electrode of the second capacitor is coupled to the second electrode of the first capacitor, a control electrode of the switching transistor is coupled to the first control signal terminal, and a first electrode of the switching transistor is coupled to the second power supply voltage terminal; the active semiconductor layer further includes an active layer of the switching transistor. The first conductive layer further includes the control electrode of the switching transistor, a second plate of the first capacitor and a second plate of the second capacitor; the second conductive layer further includes the first electrode and the second electrode of the switching transistor, a first plate of the first capacitor, and a first plate of the second capacitor, the first plate and the second plate of the first capacitor serve as the first electrode and the second electrode of the first capacitor, and the first plate and the second plate of the second capacitor serve as the first electrode and the second electrode of the second capacitor.

In some examples, the adjustment sub-circuit of the active pixel sensor includes a voltage-controlled liquid crystal capacitor including a first electrode, a liquid crystal layer, and second and third electrodes sequentially in a direction from the substrate to the planarization layer, and the second and third electrodes of the voltage-controlled liquid crystal capacitor are arranged side by side and spaced apart from each other and located on a side of the liquid crystal layer away from the first electrode of the voltage-controlled liquid crystal capacitor. The first electrode of the voltage-controlled liquid crystal capacitor is coupled to the floating diffusion node, the second electrode of the voltage-controlled liquid crystal capacitor is coupled to the second power supply voltage terminal, and the third electrode of the voltage-controlled liquid crystal capacitor is coupled to the first control signal terminal. The first electrode of the voltage-controlled liquid crystal capacitor and the control electrode of the follower transistor are in a same layer and are made of a same material; and the second and third electrodes of the voltage-controlled liquid crystal capacitor and the first electrode of the follower transistor are in a same layer and made of a same material.

In some examples, the adjustment sub-circuit of the active pixel sensor includes a PIN diode including a first electrode, an N-type semiconductor layer, an intrinsic layer, a P-type semiconductor layer, and second and third electrodes sequentially in a direction from the substrate to the planarization layer, and the second and third electrodes of the PIN diode are arranged side by side and spaced apart from each other on a side of the P-type semiconductor layer away from the intrinsic layer. The first electrode of the PIN diode is coupled to the floating diffusion node, the second electrode of the PIN diode is coupled to the second power supply voltage terminal, and the third electrode of the PIN diode is coupled to the first control signal terminal. The first electrode of the PIN diode and the control electrode of the follower transistor are in a same layer and are made of a same material; and the second and third electrodes of the PIN diode and the first electrode of the follower transistor are in a same layer and made of a same material.

In some examples, the adjustment sub-circuit of the active pixel sensor includes a PN diode including a first electrode, an N-type semiconductor layer, a P-type semiconductor layer, and second and third electrodes sequentially in a direction from the substrate to the planarization layer, and the second and third electrodes of the PN diode are arranged side by side and spaced apart from each other on a side of the P-type semiconductor layer away from the N-type semiconductor layer. The first electrode of the PN diode is coupled to the floating diffusion node, the second electrode of the PN diode is coupled to the second power supply voltage terminal, and the third electrode of the PN diode is coupled to the first control signal terminal. The first electrode of the PN diode and the control electrode of the follower transistor are in a same layer and are made of a same material; and the second and third electrodes of the PN diode and the first electrode of the follower transistor are in a same layer and made of a same material.

In some examples, the adjustment sub-circuit of the active pixel sensor includes an amorphous metal nonlinear resistor (AMNR) including a first amorphous metal plate, a second insulating layer, and second and third amorphous metal plates sequentially in a direction from the substrate to the planarization layer, and the second and third amorphous metal plates are arranged side by side and spaced apart from each other on a side of the second insulating layer away from the first amorphous metal plate. The first amorphous metal plate is coupled to the floating diffusion node, the second amorphous metal plate is coupled to the second power supply voltage terminal, and the third amorphous metal plate is coupled to the first control signal terminal. The first amorphous metal plate and the control electrode of the follower transistor are in a same layer and are made of a same material; and the second and third amorphous metal plates and the first electrode of the follower transistor are in a same layer and made of a same material.

In some examples, the adjustment sub-circuit of the active pixel sensor includes an adjustment transistor having a first electrode coupled to the second power supply voltage terminal, a second electrode coupled to the floating diffusion node, and a control electrode coupled to the first control signal terminal. The active semiconductor layer further includes an active layer of the adjustment transistor; the first conductive layer further includes a control electrode of the adjustment transistor; and the second conductive layer further includes a first electrode and a second electrode of the adjustment transistor.

DETAILED DESCRIPTION

Figure 1:
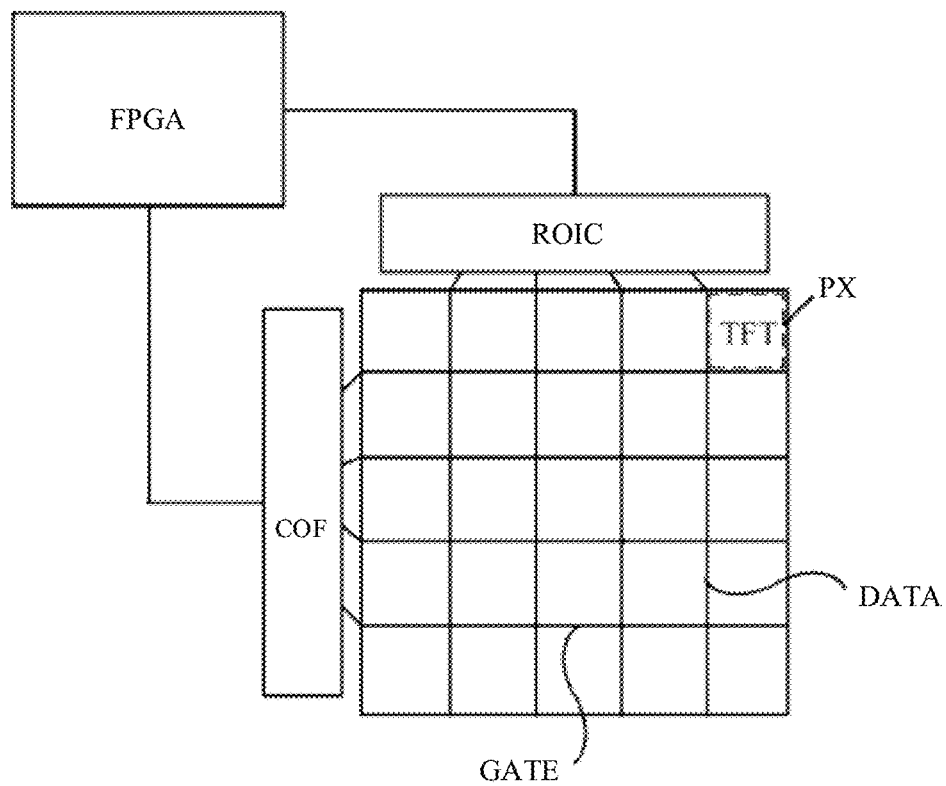
FIG. 1 is a plan view of a flat panel detector according to an embodiment of the present disclosure.

To make the objects, technical solutions and advantages of the present disclosure more apparent, the present disclosure will be described in further detail with reference to the accompanying drawings. It is apparent that the described embodiments are only some embodiments of the present disclosure but not all embodiments. All other embodiments, which can be derived by a person skilled in the art from the embodiments disclosed herein without making any creative effort, shall fall within the protection scope of the present disclosure.

The shapes and sizes of the components in the drawings are not to scale, but are merely intended to facilitate an understanding of the contents of the embodiments of the present disclosure.

Unless defined otherwise, technical or scientific terms used herein shall have the ordinary meaning as understood by one of ordinary skill in the art to which this disclosure belongs. The term "first", "second", or the like used in this disclosure is not intended to indicate any order, quantity, or importance, but rather is used to distinguish one element from another. Also, the term "a", "an", or "the" and similar terms do not denote a limitation of quantity, but rather denote the presence of at least one element. The word "comprise" or "includes", or the like means that the element or item preceding the word includes the element or item listed after the word and its equivalent, but does not exclude other elements or items. The term "coupled" or "connected" or the like is not restricted to physical or mechanical connections, but may include electric connections whether direct or indirect. The terms "upper", "lower", "left", "right", and the like are used only to indicate relative positional relationships, and when the absolute position of the object being described is changed, the relative positional relationships may also be changed accordingly.

The disclosed embodiments are not limited to the embodiments shown in the drawings, but include modifications of configurations formed due to a manufacturing process. Thus, the shapes of the regions shown in the figures are to illustrate specific shapes of regions of elements, but are not intended to be limiting.

The transistors used in the embodiments of the present disclosure may be thin film transistors or field effect transistors or other devices having the same characteristics, and since source electrode and drain electrode of the transistors used are symmetrical, there is no difference between the source electrode and the drain electrode. In the embodiments of the present disclosure, to distinguish the source electrode from the drain electrode of the transistor, one of the source electrode and the drain electrode is referred to as a first electrode, the other is referred to as a second electrode, and the gate electrode is referred to as a control electrode. In addition, the transistors can be classified into N and P types according to the characteristic of the transistors, when a P-type transistor is adopted, the first electrode is the source electrode of the P-type transistor, the second electrode is the drain electrode of the P-type transistor, and the source electrode is electrically coupled to the drain electrode when a low-level voltage is inputted to the gate electrode; when an N-type transistor is adopted, the first electrode is the source electrode of the N-type transistor, the second electrode is the drain electrode of the N-type transistor, and the source electrode is electrically coupled to the drain electrode when a high-level voltage is input to the gate electrode. Hereinafter, transistors are all described by taking N-type transistors as an example, and the implementation of P-type transistors is conceivable for those skilled in the art without inventive effort, and therefore is also within the protection scope of the embodiments of the present disclosure.

Herein, two elements disposed in a same layer means that the two elements are formed by the same patterning process and/or using the same mask. In some embodiments, the two elements may be located at the same level, but are not limited thereto.

In one aspect, embodiments of the present disclosure provide an active pixel sensor that may be applied to a flat panel detector. Taking an exemplary flat panel detector as an example, as shown in FIG. 1, the flat panel detector may include a plurality of active pixel sensors PX arranged in an array, each active pixel sensor PX includes at least one light sensing device (not shown in FIG. 1) and a reading circuit coupled to the light sensing device, and the reading circuit includes at least one thin film transistor (TFT). The light sensing device senses visible light and converts the sensed visible light into an electric signal, and the reading circuit reads the electric signal of the light sensing device, amplifies the electric signal to an output voltage to be transmitted to a subsequent device (e.g., a computer). The flat panel detector further includes a plurality of scan lines GATEs extending in a row direction of the active pixel sensors PX arranged in an array, and a plurality of read lines DATAs extending in a column direction of the active pixel sensors PX arranged in an array. The active pixel sensors PX located in the same row are coupled to the same scan line GATE, the active pixel sensors PX located in the same column are coupled to the same read line DATA, and an area where the scan line GATE and the read line DATA intersect defines an active pixel sensor PX. On this basis, as shown in FIG. 1, the flat panel detector further includes a Field-Programmable Gate Array (FPGA) chip; the scan line GATE is coupled to the FPGA chip through a Chip On Flex (COF); the COF includes a GATE driver IC (G-IC) which sequentially provides scanning signals to a plurality of scan lines GATEs and turns on thin film transistors in the reading circuit row by row. The read line DATA is coupled to the FPGA chip through a Readout IC (ROIC), the output voltage read by the reading circuit is transmitted to the read line DATA, and the read line DATA transmits the output voltage to the FPGA chip through an output interface on the ROIC.

It can be understood that, in the embodiment, the scan lines GATE are coupled to the FPGA chip through the COF, so that noise generated in signal transmission can be greatly reduced; in addition, the FPGA chip may be coupled to other devices through a printed circuit board (PCB), and a specific connection structure (for example, the PCB) may be of various types, which is not limited herein.

Figure 2:
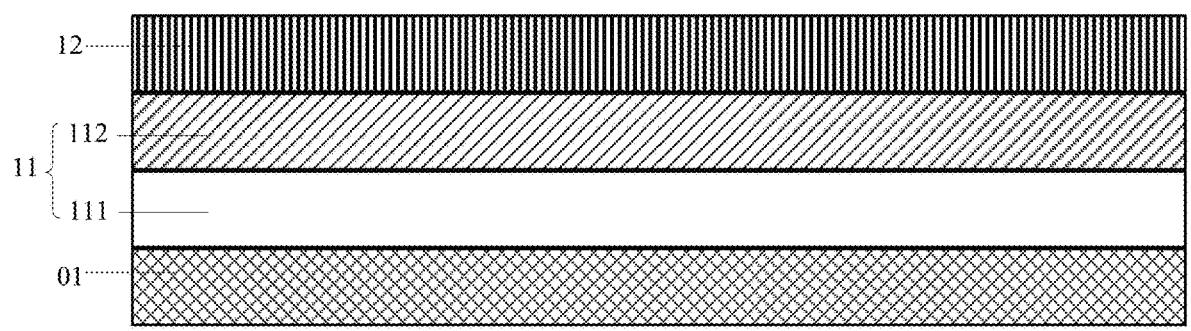
FIG. 2 is a cross-sectional view of a flat panel detector according to an embodiment of the present disclosure.

Further, referring to FIG. 2, which is a cross-sectional view illustrating an exemplary layer structure of a flat panel detector, to which the active pixel sensor according to an embodiment of the present disclosure is applied. The flat panel detector includes a substrate 01 and a light conversion layer 11 arranged on the substrate 01, the light conversion layer 11 includes a plurality of active pixel sensors PX arranged on the substrate 01 in an array, each active pixel sensor PX includes a reading circuit and a light sensing device, and therefore, the reading circuits of the active pixel sensors PX form a TFT array 111 arranged on the substrate 01, and the light sensing devices of the active pixel sensors PX form a light sensing device array 112 arranged on a side of the TFT array 111 away from the substrate 01. In addition, the flat panel detector further includes an X-ray conversion layer 12 arranged on a side of the light conversion layer 11 away from the substrate 01, the X-ray conversion layer 12 may be made of a scintillator, for example, which is a material capable of emitting light after absorbing high-energy particles or rays, and is usually processed into a crystal in application, namely, a scintillation crystal. The specific material of the scintillation crystal in the X-ray conversion layer 12 in the embodiment of the present disclosure is not limited, and may be, for example, cesium iodide, cadmium tungstate, barium fluoride, gadolinium oxysulfide (GOS), and the like. The scintillation crystal in the X-ray conversion layer 12 is subjected to an impact of high-energy particles of the X-rays attenuated after penetrating through the human body and converts the kinetic energy of the high-energy particles into light energy to emit light, that is, converts the X-rays into visible light. The visible light irradiates the light conversion layer 11, the light sensing devices of the active pixel sensors PX in the light conversion layer 11 can convert the visible light into electric charges, an electric signal corresponding to the electric charges are amplified into an output voltage by the reading circuit, and then the output voltage is read out and transmitted to the computer for image processing to form an X-ray image. It should be noted that the TFT array 111 and the light sensing device array 112 in FIG. 2 are only for illustrating the stacking relationship of the elements, and do not mean that the TFT array 111 and the light sensing device array 112 are each integrally formed as a whole layer.

Because each pixel of the flat panel detector becomes smaller, that is, the number of active pixel sensors of the flat panel detector becomes larger, the imaging definition is higher, and accordingly, the amount of visible light sensed by the sensing device in each active pixel sensor is reduced, and thus the amplitude of the electric signal is also reduced; or, in some detections, due to the decrease of the dose of the input X-rays, the intensity of the light sensed by the light sensing device in each active pixel sensor is also decreased accordingly, thereby causing the amplitude of the signal read out by the reading circuit in each active pixel sensor to be significantly decreased and resulting in the degradation of the signal-to-noise ratio. An active pixel sensor can amplify an electric signal corresponding to the electric charges converted by the light sensing device from light, and amplify the electric signal into an output voltage. However, an amplification factor (i.e., the amplification sensitivity) of a general active pixel sensor is fixed; with the increase of the light intensity of visible light, the electric signal converted by the light sensing device from the visible light is also increased, but the amplitude of the electric signal converted by the light sensing device has a certain range, so that if the amplification sensitivity of the active pixel sensor is large, the electric signal is rapidly saturated, that is, the amplitude of the electric signal after amplified reaches the upper limit of the light sensing device, and in this case, even if the light intensity is further increased, light having the increased light intensity is not sensed by the light sensing device, so that the imaging quality is not improved, which is hardly adaptive to the detection with a large range of light intensity; if the amplification sensitivity of the active pixel sensor is small, the active pixel sensor may not sense the change of the signal for the detection of a small range of light intensity. To at least solve the above problems, the inventors provide an active pixel sensor.

Figure 5:
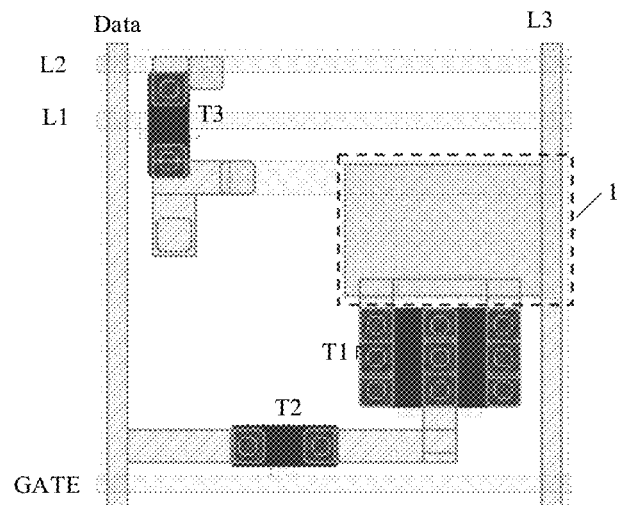
FIG. 5 is a layout diagram illustrating a pixel structure of an active pixel sensor according to an embodiment of the present disclosure.
Figure 12:
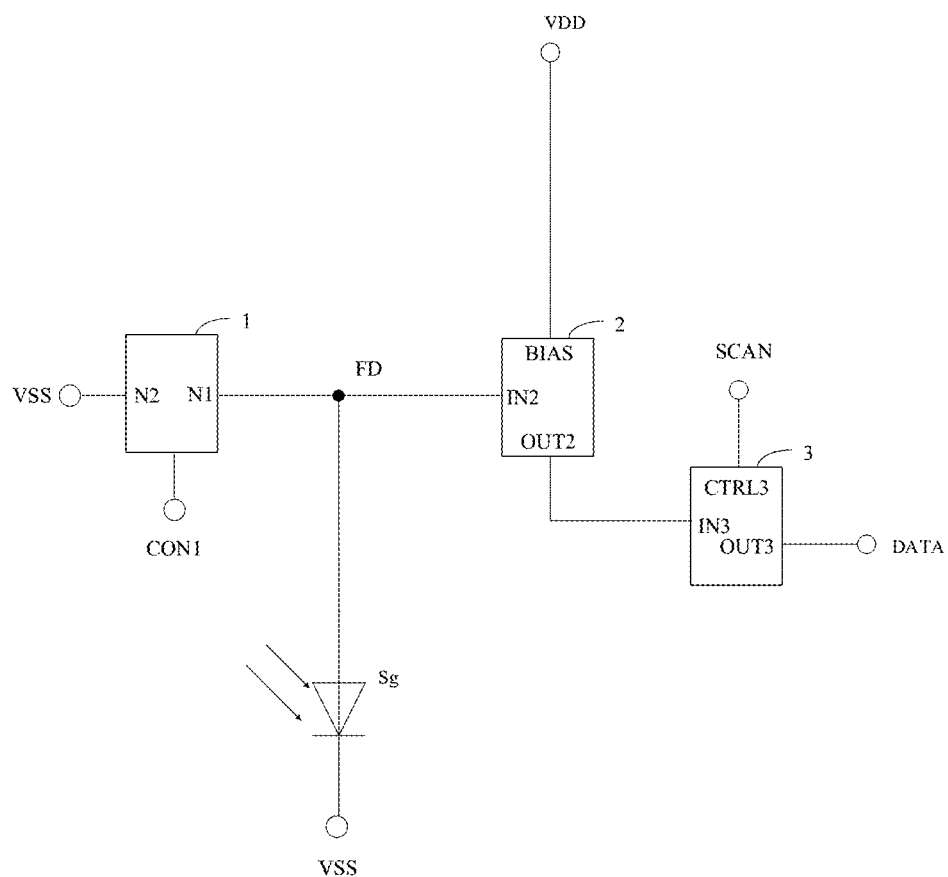
FIG. 12 is a circuit block diagram of an active pixel sensor according to an embodiment of the present disclosure.

In a first aspect, referring to FIG. 12, the present embodiment provides an active pixel sensor, which may include a light sensing device Sg and a reading circuit. The light sensing device Sg is configured to convert light sensed by the light sensing device into charges and supply the charges to a floating diffusion node FD. The reading circuit may include: an adjustment sub-circuit 1 configured to adjust, in response to a first control signal provided by a first control signal terminal, a conversion gain from an amount of the light sensed by the light sensing device Sg to a potential at the floating diffusion node FD; an amplification sub-circuit 2 having an input terminal IN2 coupled to the floating diffusion node FD, a bias terminal BIAS coupled to a first power supply voltage terminal for supplying a first power supply voltage VDD, and an output terminal OUT2, and configured to amplify a signal according to the potential at the floating diffusion node FD and output the amplified signal through the output terminal; and a read sub-circuit 3 having a control terminal CTRL 3 coupled to a scan line SCAN (or, GATE as shown in FIGS. 1 and 5), an input terminal IN3 coupled to the output terminal OUT2 of the amplification sub-circuit, and an output terminal OUT3, and configured to transmit a voltage of the input terminal IN3 of the read sub-circuit 3 to the output terminal OUT3 of the read sub-circuit 1 according to a scan signal provided by the scan line SCAN.

For example, the adjustment sub-circuit 1 may have a control terminal coupled to the first control signal terminal CONT1, a first terminal N1 coupled to the floating diffusion node FD, and a second terminal N2 coupled to a second power supply voltage terminal VSS, and may be configured to change a capacitance value between the first terminal N1 of the adjustment sub-circuit and the second terminal N2 of the adjustment sub-circuit in response to the first control signal from the first control signal terminal, such that the conversion gain from the amount of light sensed by the light sensing device Sg to the potential at the floating diffusion node FD is changed. For example, when the amount of light sensed by the light sensing device Sg is given, the potential (or the amount of change in the potential) at the floating diffusion node FD may be proportional to the conversion gain.

Figure 3:
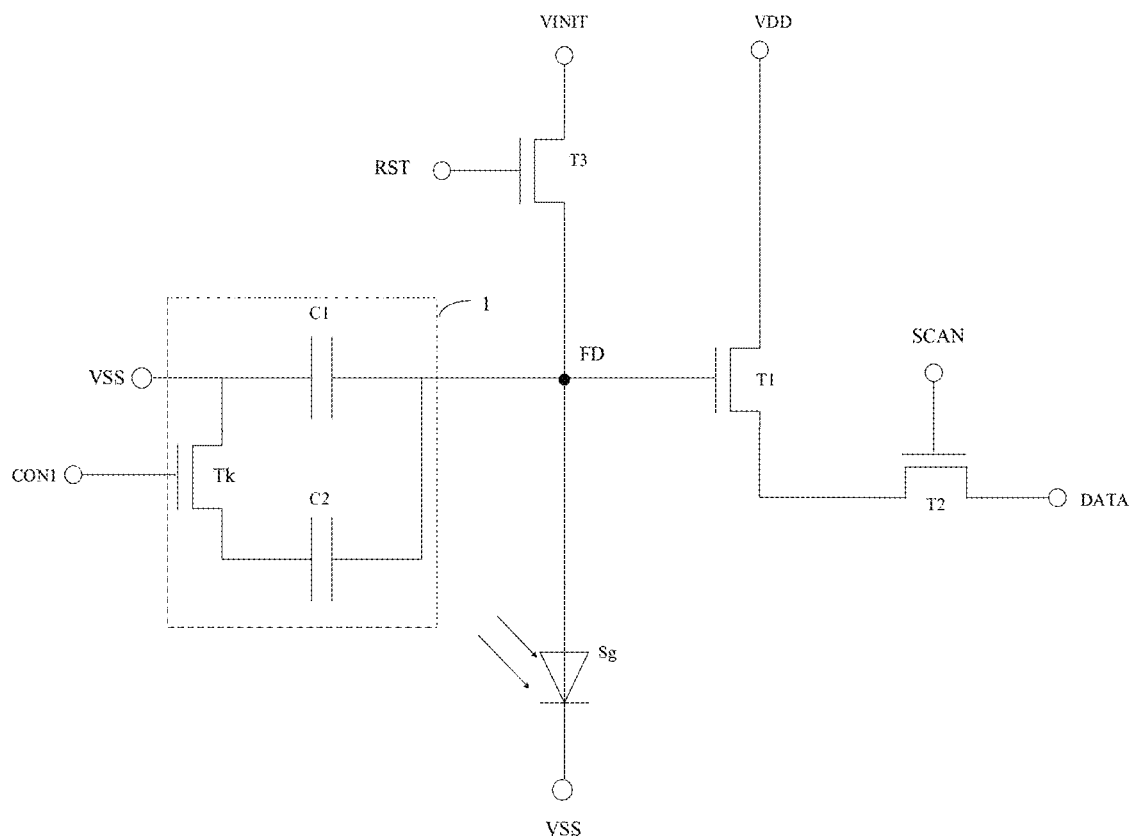
FIG. 3 is a circuit diagram of an active pixel sensor according to an embodiment of the present disclosure.

For example, referring to FIG. 3, the amplification sub-circuit 2 may include a follower transistor T1, and the read sub-circuit may include a read transistor T2. The floating diffusion node FD may be a node coupled to a first electrode of the light sensing device Sg and a control electrode of the follower transistor T1, and the photo-charges generated by the light sensing device Sg may be supplied to the floating diffusion node FD. The control electrode of the follower transistor T1 and the first electrode of the light sensing device Sg are commonly coupled to the floating diffusion node, a first electrode of the follower transistor T1 is coupled to the first power supply voltage terminal for supplying the first power supply voltage VDD, a second electrode of the follower transistor T1 is coupled to a first electrode of the read transistor T2, and the follower transistor T1 is configured to receive an electric signal (for example, a potential at the floating diffusion node FD) corresponding to the charges generated by the light sensing device Sg and amplify the electric signal into an output voltage. The adjustment sub-circuit 1 is configured to adjust the conversion gain from the amount of light sensed by the light sensing device Sg to the potential at the floating diffusion node FD in response to the first control signal. For example, the adjustment sub-circuit 1 may change the magnitude of the voltage output from the reading circuit by adjusting the capacitance value between the floating diffusion node FD and the second power supply voltage terminal, in a case where the light sensing device Sg senses a given amount of light. The control electrode of the read transistor T2 is coupled to the scan line SCAN for providing a scan signal, the first electrode of the read transistor T2 is coupled to the second electrode of the follower transistor T1, and the second electrode of the read transistor T2 is coupled to the read line DATA. The read transistor T2 is configured to read the output voltage of the follower transistor T1 in response to the scan signal, and as the light intensity of the visible light increases or decreases, the electric signal converted by the light sensing device Sg from the visible light also increases or decreases, and then the output voltage converted by the follower transistor T1 from the electric signal also increases or decreases, so that the read sub-circuit 1 reads out the output voltage and transmits it to a subsequent device (e.g., a computer), which can perform image processing to form an X-ray image.

Figure 4:
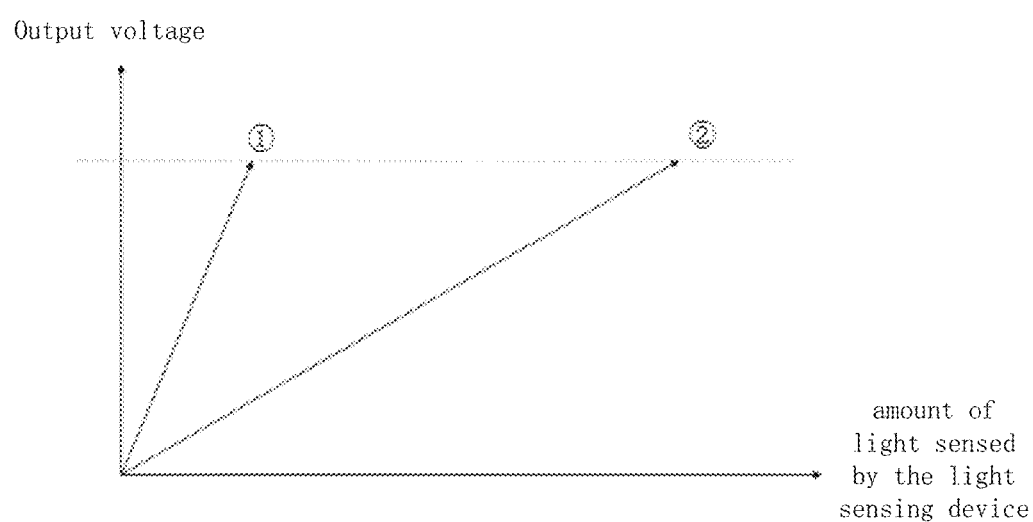
FIG. 4 is a graph of output-voltage-versus-electric-signal characteristic of an active pixel sensor according to an embodiment of the present disclosure.

The active pixel sensor according to an embodiment of the present disclosure can adapt to various types of detection because the adjustment sub-circuit 1 is provided, and the adjustment sub-circuit 1 may adjust the conversion gain from the amount of light sensed by the light sensing device Sg to the potential at the floating diffusion node FD as needed. For example, referring to FIG. 4, if the amount of light sensed by the light sensing device Sg is small and the variation range is small, the adjustment sub-circuit 1 may increase the conversion gain from the amount of light sensed by the light sensing device Sg to the potential at the floating diffusion node FD, so that the photoelectric conversion gain of the active pixel sensor is large, and as shown by a curve ① in FIG. 4, as the amount of light sensed by the light sensing device Sg increases, the output voltage of the follower transistor T1 also rapidly increases, so that the active pixel sensor can detect a small change of visible light, that is, the detection of the active pixel sensor is more sensitive; if the variation range of the amount of light sensed by the light sensing device Sg is large, the adjustment sub-circuit 1 can reduce the conversion gain from the amount of light sensed by the light sensing device Sg to the potential at the floating diffusion node FD, so that the photoelectric conversion gain of the pixel sensor is small, as shown by a curve ② in FIG. 4, as the amount of light sensed by the light sensing device increases, the output voltage of the follower transistor T1 also increases, but the increasing speed is smaller than that of the curve ①, thereby avoiding rapid saturation (that is, reaching the upper limit of the detection range) for an electric signal, and the active pixel sensor can have a larger detection range. To sum up, the active pixel sensor can have adjustable sensitivity by adjusting the conversion gain from the amount of light sensed by the light sensing device Sg to the potential at the floating diffusion node FD by the adjustment sub-circuit 1, and thus can adapt to detection under various scenes.

Further, the specific circuit structure of the reading circuit of the active pixel sensor according to an embodiment of the present disclosure may include various types, for example, referring to FIG. 3, the reading circuit of the active pixel sensor may include a follower transistor T1, an adjustment sub-circuit 1, a read transistor T2, and the like. A control electrode of the follower transistor T1 is coupled to a first electrode of the light sensing device Sg; a first electrode of the follower transistor T1 is coupled to a first power supply voltage terminal for providing a first power supply voltage VDD; and a second electrode of the follower transistor T1 is coupled to the read transistor T2. The light sensing device Sg is configured to sense visible light, and convert the visible light into electric charges according to the light intensity of the visible light and generates an electric signal, the electric signal is output to the control electrode of the follower transistor T1 to determine the magnitude of current flowing through the follower transistor T1, and therefore the light intensity of the visible light sensed by the light sensing device Sg may be obtained by measuring the current flowing through the follower transistor T1. The adjustment sub-circuit 1 is coupled to the control electrode of the follower transistor T1, and is capable of adjusting the photoelectric conversion sensitivity of the pixel sensor. Specifically, the adjustment sub-circuit 1 may adjust a conversion gain from the amount of light sensed by the light sensing device Sg to the potential at the floating diffusion node FD, thereby achieving the adjustment of the amplification sensitivity of the follower transistor T1. The control electrode of the read transistor T2 is coupled to the scan line SCAN for providing a scan signal, the first electrode of the read transistor T2 is coupled to the follower transistor T1, and the second electrode of the read transistor T2 is coupled to the read line DATA. Referring to FIG. 1, the scan signals supplied from the G-IC in the COF are applied to respective scan lines GATE row by row in accordance with the timing supplied from the G-IC, each scan line GATE is coupled to the control electrodes of the read transistors T2 in one row of the active pixel sensors, so that the read transistors T2 in the rows of the active pixel sensors are turned on row by row, the output voltage of the follower transistor T1 is read out by the read transistor T2, and is transmitted to the FPGA through the read line DATA coupled to the second electrode of the read transistor T2.

Figure 13:
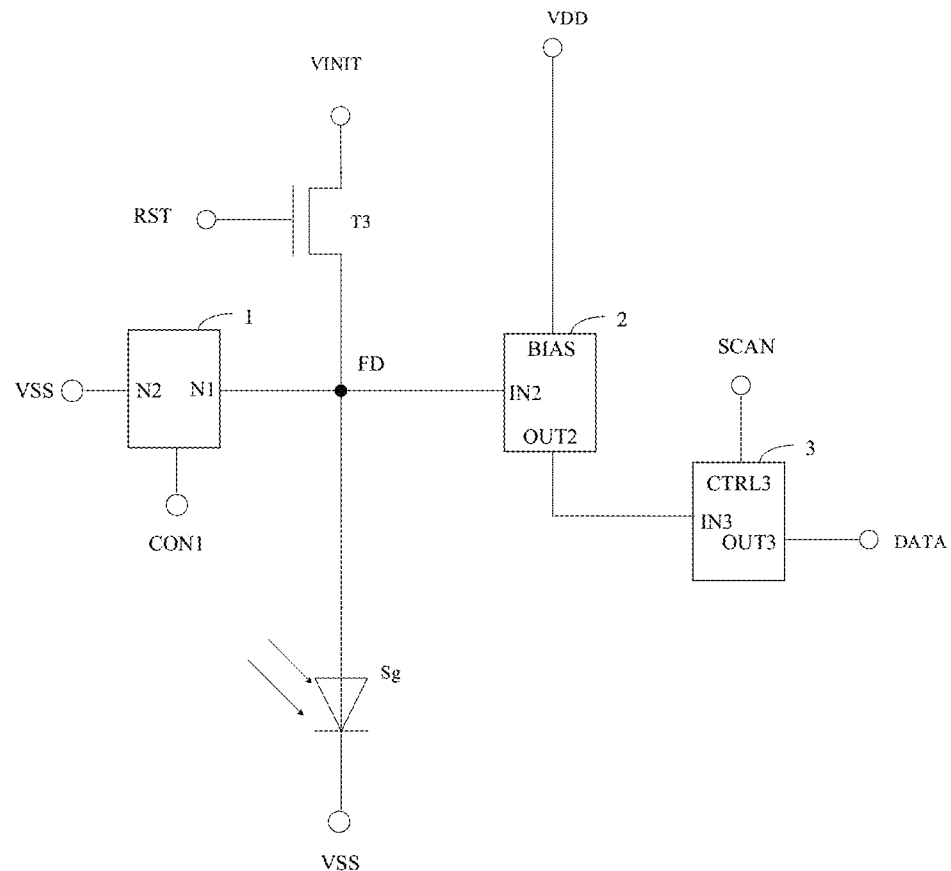
FIG. 13 is a circuit block diagram of an active pixel sensor according to an embodiment of the present disclosure.

In some examples, referring to FIG. 13, the active pixel sensor according to an embodiment of the present disclosure may further include a reset transistor T3. The reset transistor T3 is configured to transmit an initialization signal VINIT to the floating diffusion node FD in response to a reset control signal RST, that is, to load the initialization signal VINIT to the floating diffusion node FD in response to the reset control signal RST, so as to reset the potential on the floating diffusion node FD. Specifically, the control electrode of the reset transistor T3 may be coupled to a reset signal terminal for providing the reset control signal RST, a first electrode of the reset transistor T3 is coupled to an initialization signal terminal for providing the initialization signal VINIT, and the second electrode of the reset transistor T3 is coupled to the floating diffusion node FD. The reset control signal RST is applied to the control electrode of the reset transistor T3, and the reset transistor T3 is turned on to load the initialization signal VINIT at its first electrode to the floating diffusion node FD. It should be noted that, a circuit structure including two reset transistors may also be adopted for resetting, which is not limited herein.

Referring to FIGS. 1 and 5, taking a case where the follower transistor T1, the read transistor T2 and the reset transistor T3 are included in the reading circuit of each active pixel sensor as an example, as shown in FIG. 1, a plurality of active pixel sensors PX are arranged in an array on a substrate 01, a plurality of scan lines GATE extend in a row direction, and a plurality of read lines DATA extend in a column direction. FIG. 5 is a layout diagram showing a pixel structure of a single active pixel sensor PX (in which the light sensing device Sg is not shown), and as shown in FIG. 5, a reset signal line L1 extends in a row direction and is coupled to a control electrode of the reset transistor T3, and the reset signal line L1 is coupled to the reset signal terminal to transmit the reset control signal RST. The first power supply voltage line L2 extends in the row direction and is coupled to a first electrode of the follower transistor T1, and the first power supply voltage line L2 is coupled to a first power supply voltage terminal to transmit the first power supply voltage VDD. An initialization signal line L3 extends in a column direction and is coupled to the first electrode of the reset transistor T3, and the initialization signal line L3 is coupled to an initialization signal terminal to transmit an initialization signal VINIT. The adjustment sub-circuit 1 may include various types of circuit structures, and may be disposed at various positions. FIG. 5 exemplarily shows that the layout of the adjustment sub-circuit is between the read line DATA and the initialization signal line L3, and between the follower transistor T1 and the reset signal line L1.

It should be noted that, in the embodiments of the present disclosure, one of the second power supply voltage VSS and the first power supply voltage VDD is a high voltage, and the other is a low voltage. In the following description, it is described by taking a case where the second power supply voltage VSS constantly maintain a low voltage and the first power supply voltage VDD constantly maintain a high voltage as an example, and is not limited here.

In order to make the specific implementation of the active pixel sensor in this embodiment clear, the operation of the pixel driving circuit is described. The following description will be made by taking an example in which the reading circuit of the active pixel sensor includes the follower transistor T1, the read transistor T2, and the reset transistor T3. The operation of an active pixel sensor typically includes three phases: phase T1 (also called reset phase), phase T2 (also called exposure phase), and phase T3 (also called read phase). It should be noted that the second electrode of the light sensing device Sg is coupled to the second power supply voltage terminal, and always receive the second power supply voltage VSS during the three phases.

In phase T1, the reset transistor T3 is turned on by applying a pulse to the control electrode of the reset transistor T3 through the reset control signal RST, and the initialization signal VINIT at the first electrode of the reset transistor T3 is applied to the control electrode of the follower transistor T1 and the first electrode (i.e., the floating diffusion node FD) of the light sensing device Sg for resetting.

In phase T2, visible light irradiates the light sensing device Sg, and photons strike the light sensing device Sg to generate electron-hole pairs. The resulting charges migrates to the first electrode of the light sensing device Sg, so that holes are attracted to the second electrode of the light sensing device Sg while electrons are attracted to the first electrode of the light sensing device Sg, and the charges accumulated at the first electrode of the light sensing device Sg form an electric signal. The first electrode of the light sensing device Sg is coupled to the adjustment sub-circuit 1 and also to the follower transistor T1, in particular to the control electrode of the follower transistor T1. The amount of charges generated by the light sensing device Sg is related to the potential at the floating diffusion node FD (i.e., the control electrode of the follower transistor T1), which may decide the magnitude of the current flowing through the follower transistor T1, thereby affecting the magnitude of the output voltage. The adjustment sub-circuit 1 adjusts the conversion gain from the amount of light sensed by the light sensing device Sg to the potential at the floating diffusion node FD according to the first control signal CON1 in response to the first control signal CON1, and specifically, the adjustment sub-circuit 1 can adjust its own capacitance according to the first control signal, and the capacitance of the adjustment sub-circuit 1 is inversely proportional to the above conversion gain. The larger the capacitance, the lower the conversion gain; and the smaller the capacitance, the higher the conversion gain. In phase T2, the light sensing device Sg senses the visible light and converts it into electric charges, and the follower transistor T1 proportionally amplifies the electric signal corresponding to the electric charges and adjusted by the adjustment sub-circuit 1 into an output voltage, and accumulates it at the second electrode of the follower transistor T1.

It should be noted that the step in which the adjustment sub-circuit 1 adjusts its own capacitance in response to the first control signal CON1 may be completed before phase T2, or may be performed in phase T2, which is not limited herein.

In phase T3, a pulse is applied to the control electrode of the read transistor T2 through the scan signal SCAN to turn on the read transistor T2, and since the first electrode of the read transistor T2 is coupled to the second electrode of the follower transistor T1, the output voltage of the second electrode of the follower transistor T1 is read out to the read line DATA after the read transistor T2 is turned on.

In the active pixel sensor according to an embodiment of the present disclosure, the adjustment sub-circuit 1 can adjust the conversion gain from the amount of light sensed by the light sensing device Sg to the potential at the floating diffusion node FD, and the circuit structure of the adjustment sub-circuit 1 may include various types, for example, the adjustment sub-circuit 1 may adjust the potential at the floating diffusion node FD by adjusting the capacitance of itself so as to adjust the photoelectric conversion gain, the larger the capacitance of the adjustment sub-circuit 1 is, the lower the photoelectric conversion gain is, and accordingly, the smaller the capacitance of the adjustment sub-circuit 1 is, the higher the photoelectric conversion gain is. The specific structure of the adjustment sub-circuit 1 is exemplified below. It should be noted that, the following is described by taking the example that the amplification sub-circuit of the active pixel sensor includes the follower transistor T1, the read sub-circuit includes the read transistor T2, and the reset sub-circuit includes the reset transistor T3, but the present disclosure is not limited thereto.

FIG. 3 shows a circuit diagram of an active pixel sensor in some embodiments.

Referring to FIG. 3, the active pixel sensor includes the follower transistor T1, the adjustment sub-circuit 1, the read transistor T2, and the reset transistor T3. The first electrode of the follower transistor T1 is coupled to the first power supply voltage terminal to receive the first power supply voltage VDD, the control electrode of the follower transistor T1 is coupled to the first electrode of the light sensing device Sg, and the second electrode of the follower transistor T1 is coupled to the first electrode of the read transistor T2. The control electrode of the read transistor T2 is coupled to the scan line SCAN for receiving the scan signal, the first electrode of the read transistor T2 is coupled to the second electrode of the follower transistor T1, and the second electrode of the read transistor T2 is coupled to the read line DATA. The control electrode of the reset transistor T3 is coupled to the reset signal terminal for receiving the reset control signal RST, the first electrode of the reset transistor T3 is coupled to the initialization signal terminal for receiving the initialization signal VINIT, and the second electrode of the reset transistor T3 is coupled to the first electrode of the light sensing device Sg and the control electrode of the follower transistor T1, and the reset transistor T3 is configured to reset the potential on the first electrode of the light sensing device Sg and the control electrode of the follower transistor T1.

The adjustment sub-circuit 1 may include a first capacitor C1, a second capacitor C2 and a switching transistor Tk. A first electrode of the first capacitor C1 is coupled to the first electrode of the switching transistor Tk; a first electrode of the second capacitor C2 is coupled to a second electrode of the switching transistor Tk; a control electrode of the switching transistor Tk is coupled to a first control signal terminal for providing the first control signal CON1; a second electrode of the first capacitor C1 and a second electrode of the second capacitor C2 are both coupled to the follower transistor T1. That is, the switching transistor Tk is coupled in series with the second capacitor C2, and the branch consisting of the switching transistor Tk and the second capacitor C2 is coupled in parallel with the first capacitor C1. The first electrode of the switching transistor Tk is coupled to the second power supply voltage terminal for receiving the second power supply voltage VSS; the second electrode of the first capacitor C1 and the second electrode of the second capacitor C2 are both coupled to the first electrode of the light sensing device Sg, and are also both coupled to the control electrode of the follower transistor T1. The second power supply voltage VSS applied to the first electrode of the switching transistor Tk is always kept at a low level, and the on state of the switching transistor Tk can be changed by the voltage level of the first control signal CON1, so that the capacitance of the adjustment sub-circuit 1 can be changed. For example, if the conversion gain from the amount of light sensed by the light sensing device Sg to the potential at the floating diffusion node FD needs to be made large, then the switching transistor Tk is turned off by the first control signal CON1, the second capacitor C2 is kept open-circuited, and the capacitance of the adjustment sub-circuit 1 is the capacitance of the first capacitor C1; if the conversion gain from the amount of light sensed by the light sensing device Sg to the potential at the floating diffusion node FD needs to be made small, then the switching transistor Tk is turned on by the first control signal CON1, the second capacitor C2 is electrically coupled to the circuit, and the capacitance of the adjustment sub-circuit 1 is the sum of the capacitances of the first capacitor C1 and the second capacitor C2.

Figure 6:
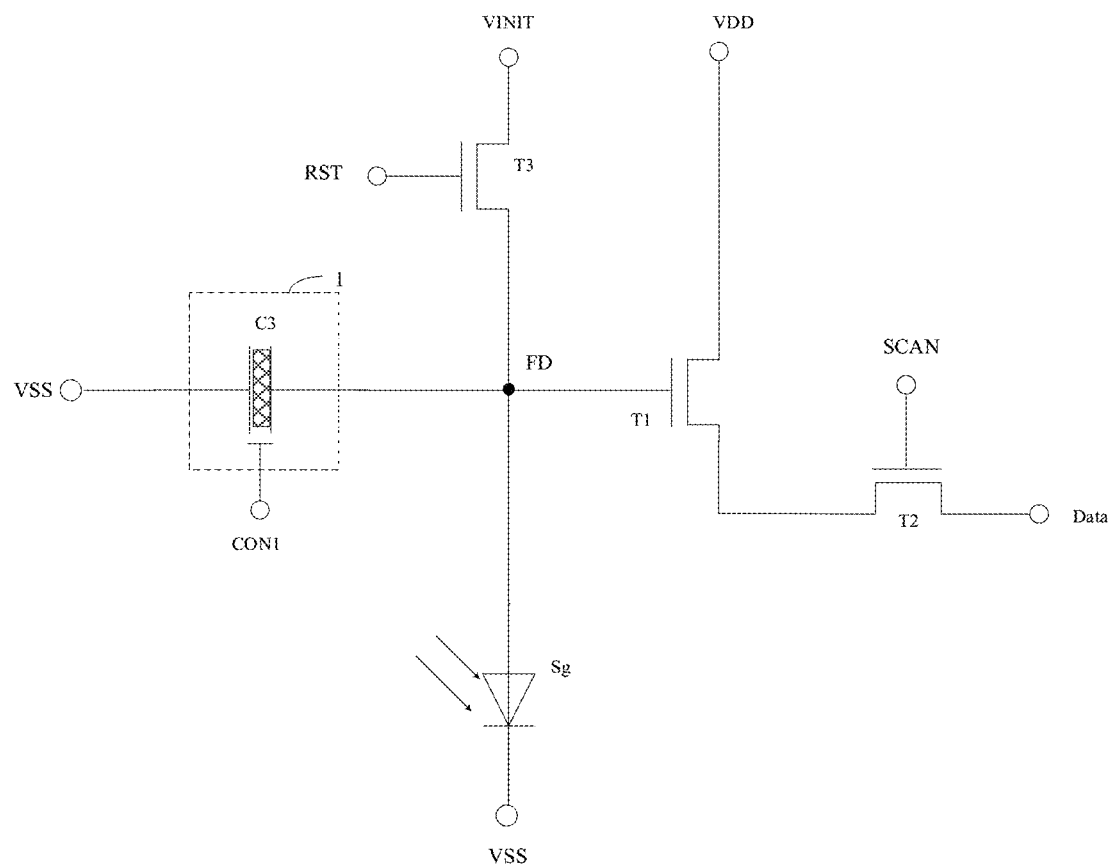
FIG. 6 is a circuit diagram of an active pixel sensor according to an embodiment of the present disclosure.

FIG. 6 shows a circuit diagram of an active pixel sensor in some embodiments.

Referring to FIG. 6, the active pixel sensor includes the follower transistor T1, the adjustment sub-circuit 1, the read transistor T2, and the reset transistor T3. The first electrode of the follower transistor T1 is coupled to the first power supply voltage terminal to receive the first power supply voltage VDD, the control electrode of the follower transistor T1 is coupled to the first electrode of the light sensing device Sg, and the second electrode of the follower transistor T1 is coupled to the first electrode of the read transistor T2. The control electrode of the read transistor T2 is coupled to the scan line SCAN for receiving the scan signal, the first electrode of the read transistor T2 is coupled to the second electrode of the follower transistor T1, and the second electrode of the read transistor T2 is coupled to the read line DATA. The control electrode of the reset transistor T3 is coupled to the reset signal terminal for receiving the reset control signal RST, the first electrode of the reset transistor T3 is coupled to the initialization signal terminal for receiving the initialization signal VINIT, and the second electrode of the reset transistor T3 is coupled to the first electrode of the light sensing device Sg and the control electrode of the follower transistor T1, and the reset transistor T3 is configured to reset the potential on the first electrode of the light sensing device Sg and the control electrode of the follower transistor T1.

Figure 16:
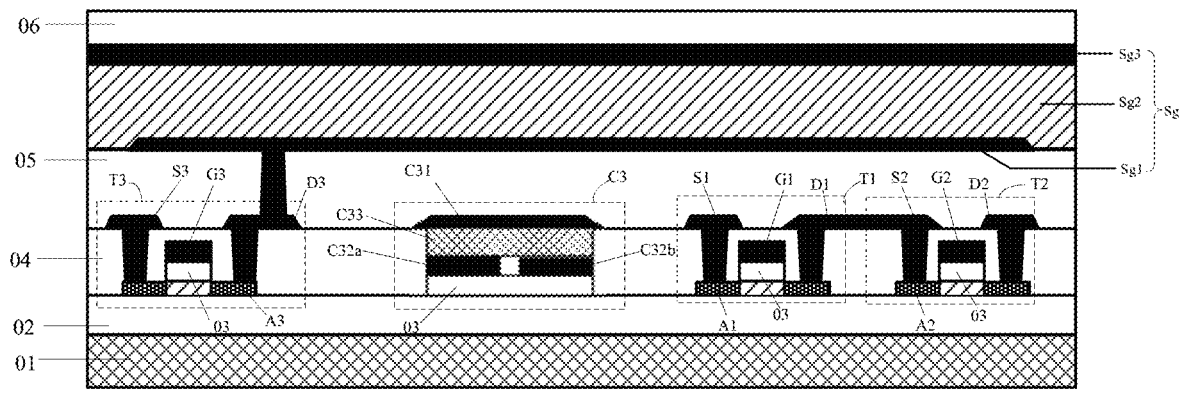
FIG. 16 is a cross-sectional view illustrating a layer structure of an active pixel sensor according to an embodiment of the present disclosure.

The adjustment sub-circuit 1 may include a voltage-controlled liquid crystal capacitor C3 having a first electrode, a liquid crystal layer on a side of the first electrode, and second and third electrodes, arranged side by side and spaced apart from each other, on a side of the liquid crystal layer away from the first electrode (see FIG. 16 for detail). That is, the liquid crystal layer is positioned between the first electrode and the second and third electrodes. The deflection angle of liquid crystal molecules of the liquid crystal layer may be adjusted by controlling an electric field between the second and third electrodes arranged side by side and the first electrode, so that the voltage on the voltage-controlled liquid crystal capacitor can be changed. The first electrode of the voltage-controlled liquid crystal capacitor is coupled to the floating diffusion node FD, the second electrode of the voltage-controlled liquid crystal capacitor is coupled to the second power supply voltage terminal to receive the second power supply voltage VSS (i.e., a reference voltage), and the third electrode of the voltage-controlled liquid crystal capacitor is coupled to the first control signal terminal, and the first control signal CON1 is a bias voltage.

Figure 7:
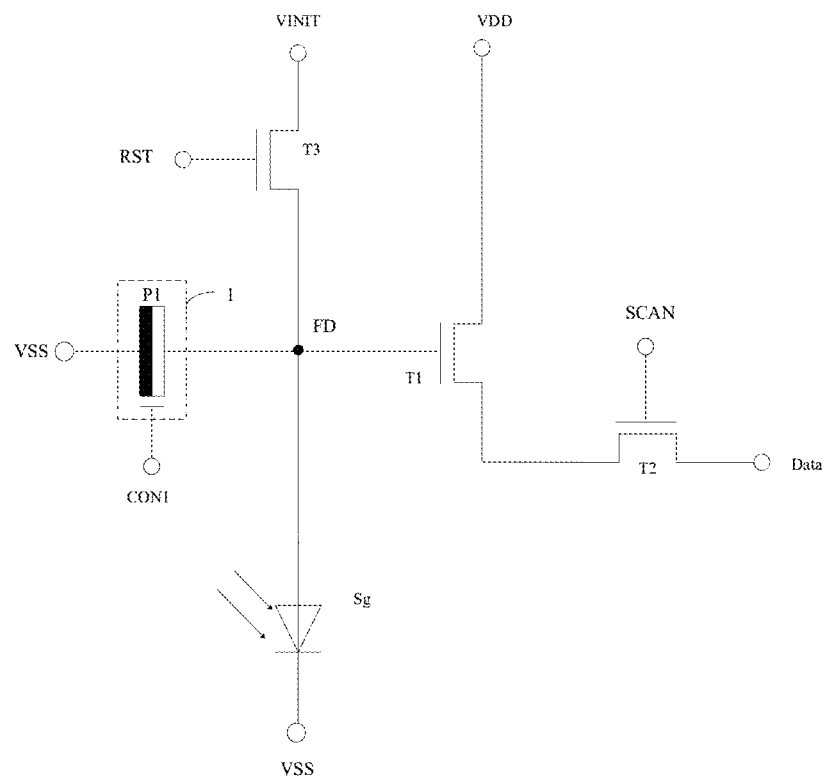
FIG. 7 is a circuit diagram of an active pixel sensor according to an embodiment of the present disclosure.

FIG. 7 shows a circuit diagram of an active pixel sensor in some embodiments.

Referring to FIG. 7, the active pixel sensor includes the follower transistor T1, the adjustment sub-circuit 1, the read transistor T2, and the reset transistor T3. The first electrode of the follower transistor T1 is coupled to the first power supply voltage terminal to receive the first power supply voltage VDD, the control electrode of the follower transistor T1 is coupled to the first electrode of the light sensing device Sg, and the second electrode of the follower transistor T1 is coupled to the first electrode of the read transistor T2. The control electrode of the read transistor T2 is coupled to the scan line SCAN for receiving the scan signal, the first electrode of the read transistor T2 is coupled to the second electrode of the follower transistor T1, and the second electrode of the read transistor T2 is coupled to the read line DATA. The control electrode of the reset transistor T3 is coupled to the reset signal terminal for receiving the reset control signal RST, the first electrode of the reset transistor T3 is coupled to the initialization signal terminal for receiving the initialization signal VINIT, and the second electrode of the reset transistor T3 is coupled to the first electrode of the light sensing device Sg and the control electrode of the follower transistor T1, and the reset transistor T3 is configured to reset the potential on the first electrode of the light sensing device Sg and the control electrode of the follower transistor T1.

The adjustment sub-circuit 1 includes a varactor diode P1, which is a semiconductor device having a voltage-dependent capacitance. The varactor diode P1 may have a first electrode coupled to the floating diffusion node FD, a second electrode coupled to the second power supply voltage terminal, and a control electrode coupled to the first control signal terminal, and a capacitance between the first electrode and the second electrode of the varactor diode P1 may be changed according to a voltage of the control electrode of the varactor diode.

In some examples, the varactor diode includes various types, such as an NMOS transistor, a PMOS transistor, a PIN diode, a PN diode, and the like, which is not limited herein.

When the varactor diode P1 is a PIN diode, the PIN diode has a first electrode, a semiconductor structure on a side of the first electrode, and second and third electrodes arranged side by side and spaced apart from each other on a side of the semiconductor structure away from the first electrode. The first electrode of the PIN diode is coupled to the floating diffusion node FD, the second electrode of the PIN diode is coupled to the second power supply voltage terminal, and the third electrode of the PIN diode is coupled to the first control signal terminal. It will be described later with reference to FIG. 18.

When the varactor diode P1 is a PN diode, the PN diode has a first electrode, a semiconductor structure on a side of the first electrode, and second and third electrodes arranged side by side and spaced apart from each other on a side of the semiconductor structure away from the first electrode. The first electrode of the PN diode is coupled to the floating diffusion node FD, the second electrode of the PN diode is coupled to the second power supply voltage terminal, and the third electrode of the PN diode is coupled to the first control signal terminal. It will be described later with reference to FIG. 17.

Figure 8:
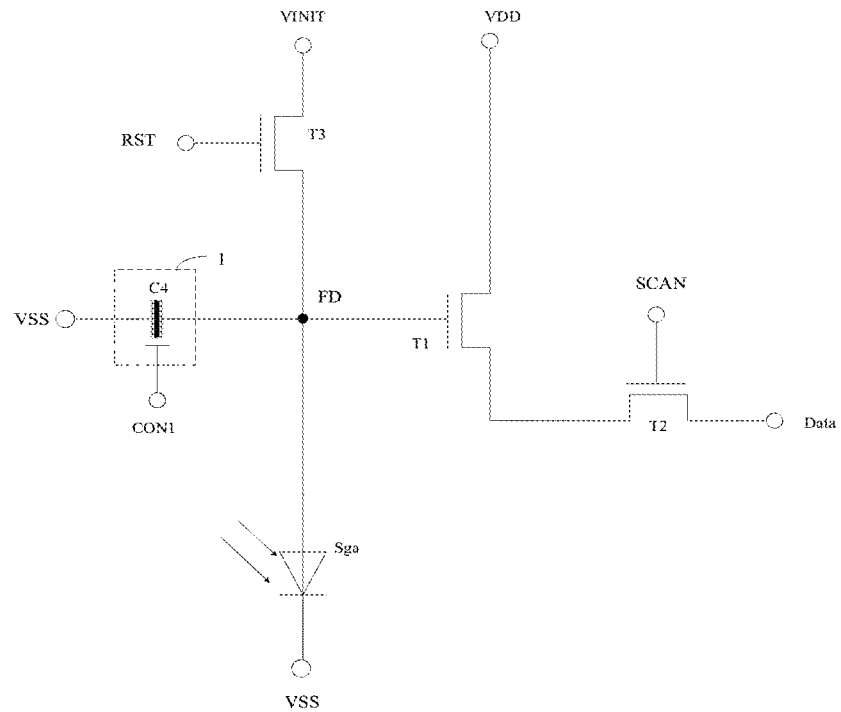
FIG. 8 is a circuit diagram of an active pixel sensor according to an embodiment of the present disclosure.

FIG. 8 shows a circuit diagram of an active pixel sensor in some embodiments.

Referring to FIG. 8, the active pixel sensor includes the follower transistor T1, the adjustment sub-circuit 1, the read transistor T2, and the reset transistor T3. The first electrode of the follower transistor T1 is coupled to the first power supply voltage terminal to receive the first power supply voltage VDD, the control electrode of the follower transistor T1 is coupled to the first electrode of the light sensing device Sg, and the second electrode of the follower transistor T1 is coupled to the first electrode of the read transistor T2. The control electrode of the read transistor T2 is coupled to the scan line SCAN for receiving the scan signal, the first electrode of the read transistor T2 is coupled to the second electrode of the follower transistor T1, and the second electrode of the read transistor T2 is coupled to the read line DATA. The control electrode of the reset transistor T3 is coupled to the reset signal terminal for receiving the reset control signal RST, the first electrode of the reset transistor T3 is coupled to the initialization signal terminal for receiving the initialization signal VINIT, and the second electrode of the reset transistor T3 is coupled to the first electrode of the light sensing device Sg and the control electrode of the follower transistor T1, and the reset transistor T3 is configured to reset the potential on the first electrode of the light sensing device Sg and the control electrode of the follower transistor T1.

Figure 9:
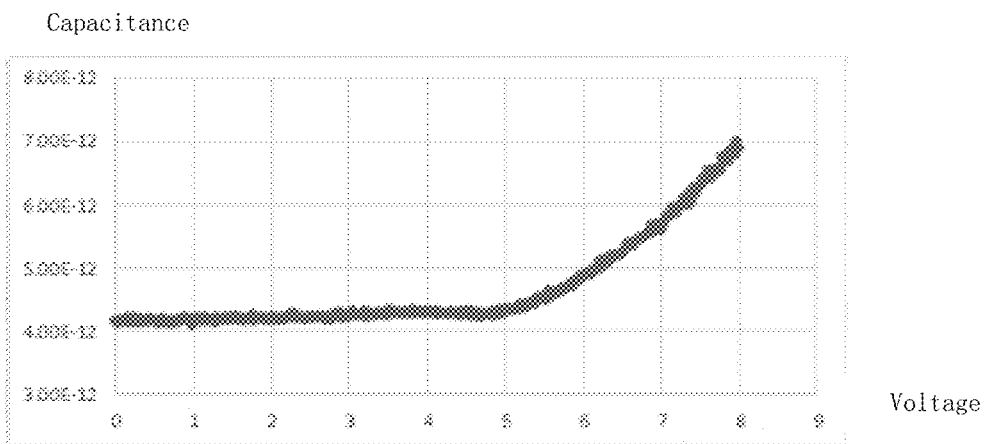
FIG. 9 is a graph of capacitance-voltage characteristics of an amorphous metal nonlinear resistor in the active pixel sensor of FIG. 8.

The adjustment sub-circuit 1 may include an amorphous metal nonlinear resistor (AMNR) C4 having a first electrode, an insulating layer at a side of the first electrode, and second and third electrodes arranged side by side and spaced apart from each other on a side of the insulating layer away from the first electrode. The first electrode of the AMNR C4 is coupled to the floating diffusion node FD, the second electrode of the AMNR C4 is coupled to the second power supply voltage terminal, and the third electrode of the AMNR C4 is coupled to the first control signal terminal. Specifically, the AMNR may have a three-layer structure of a first amorphous metal plate, a second insulating layer, and a second amorphous metal plate, and since the upper and lower plates are all amorphous metal plates, the AMNR has a low roughness, and can be ultra-thinned, and thus its overall structure is small and easy to be integrated. FIG. 9 shows the capacitance-voltage characteristic curve of the AMNR. It can be seen that the capacitance of the AMNR C4 can be changed by controlling the voltage between the first amorphous metal plate and the second amorphous metal plate. For example, the second amorphous metal plate may include two portions electrically insulated and spaced apart from each other to serve as the second and third electrodes of the AMNR C4 arranged side by side and spaced apart from each other. It will be described later with reference to FIG. 19.

Figure 10:
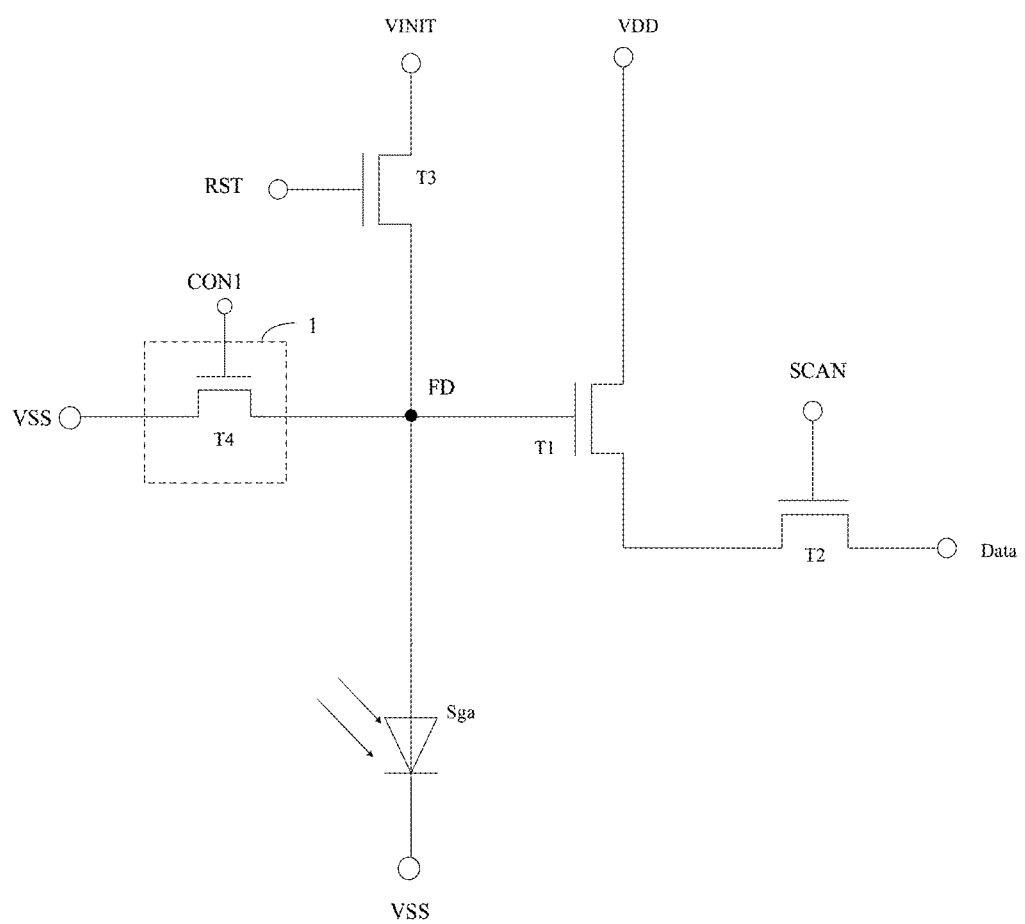
FIG. 10 is a circuit diagram of an active pixel sensor according to an embodiment of the present disclosure.

FIG. 10 shows a circuit diagram of an active pixel sensor in some embodiments.

Referring to FIG. 10, the active pixel sensor includes the follower transistor T1, the adjustment sub-circuit 1, the read transistor T2, and the reset transistor T3. The first electrode of the follower transistor T1 is coupled to the first power supply voltage terminal to receive the first power supply voltage VDD, the control electrode of the follower transistor T1 is coupled to the first electrode of the light sensing device Sg, and the second electrode of the follower transistor T1 is coupled to the first electrode of the read transistor T2. The control electrode of the read transistor T2 is coupled to the scan line SCAN for receiving the scan signal, the first electrode of the read transistor T2 is coupled to the second electrode of the follower transistor T1, and the second electrode of the read transistor T2 is coupled to the read line DATA. The control electrode of the reset transistor T3 is coupled to the reset signal terminal for receiving the reset control signal RST, the first electrode of the reset transistor T3 is coupled to the initialization signal terminal for receiving the initialization signal VINIT, and the second electrode of the reset transistor T3 is coupled to the first electrode of the light sensing device Sg and the control electrode of the follower transistor T1, and the reset transistor T3 is configured to reset the potential on the first electrode of the light sensing device Sg and the control electrode of the follower transistor T1.

The adjustment sub-circuit 1 may include an adjustment transistor T4 having a first electrode coupled to the second power supply voltage terminal to receive the second power supply voltage VSS, a second electrode coupled to the follower transistor T1, in particular to the floating diffusion node FD, and a control electrode coupled to the first control signal terminal to receive the first control signal CON1. The second power supply voltage VSS received by the first electrode of the adjustment transistor T4 is always active, and the adjustment transistor T4 can operate in different operating states (for example, an off state, a saturation state, and an amplification state) by the voltage of the first control signal CON1, and the adjustment transistor T4 in different operating states has different capacitances, so that the conversion gain from the amount of light sensed by the light sensing device Sg to the potential at the floating diffusion node FD can be changed.

Figure 11:
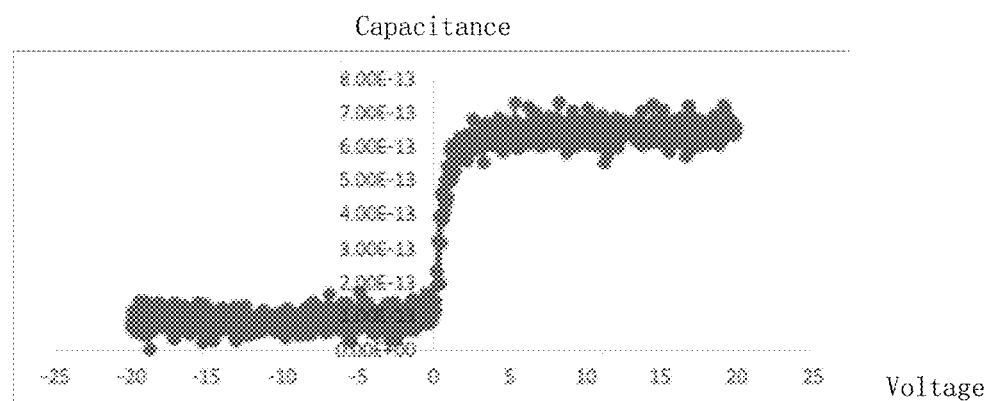
FIG. 11 is a graph of capacitance-voltage characteristics of an adjustment transistor in the active pixel sensor of FIG. 10.

Referring to FIG. 11 which shows a capacitance-voltage characteristic curve of the adjustment transistor T4, it can be seen that by controlling the voltage of the first control signal CON1, the gate-source voltage Vgs of the adjustment transistor T4 can be changed, and thus the capacitance of the adjustment transistor T4 can be changed.

It should be noted that the adjustment sub-circuit 1 in the above embodiments may also be implemented to have various specific structures, and the above exemplary structure is only used for convenience of description, and does not limit the present application.

Figure 14A:
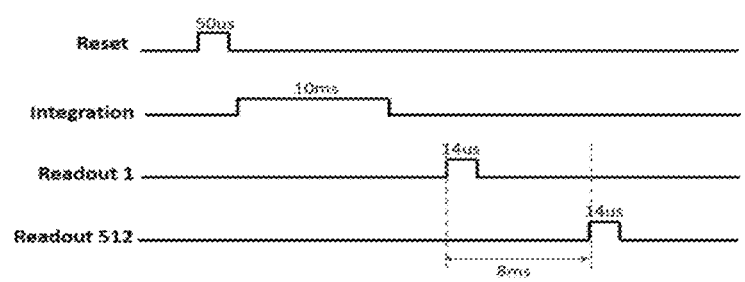
FIG. 14a is a simulation timing diagram of an active pixel sensor according to an embodiment of the present disclosure.
Figures 14B, 15:
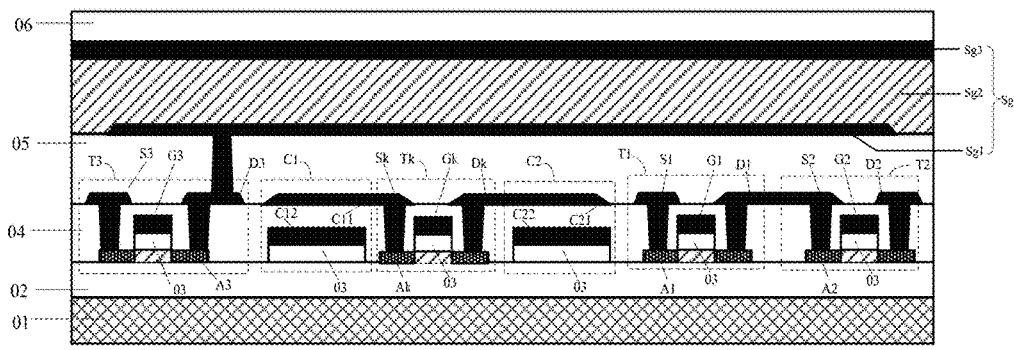
FIG. 14b is a table of simulation results of an active pixel sensor according to an embodiment of the present disclosure.
FIG. 15 is a cross-sectional view illustrating a layer structure of an active pixel sensor according to an embodiment of the present disclosure.

The inventors have simulated with the active pixel sensor according to the embodiment. The simulation timing is shown in FIG. 14a, where the signal "Reset" is the reset control signal RST, the signal "Integration" is an acquisition signal, and the signals "readout1" and "readout512" respectively are the scan signals SCAN of the first row of active pixel sensors and the $512^{th}$ row of active pixel sensors. The results of the simulation with the timing of FIG. 14a are shown in FIG. 14b. It should be noted that, the light sensing device Sg of the active pixel sensor generates charges (i.e., photo-charges) after sensing the visible light, and the amount of the photo-charges is in direct proportion to the radiation intensity of the visible light received by the light sensing device Sg, and the current corresponding to the photo-charges is the photocurrent in FIG. 14b; in a state where the light sensing device Sg of the active pixel sensor does not sense any light, the light sensing device Sg also generates charges, which correspond to a dark current in FIG. 14b. It should be noted that, in FIG. 14, "Cst" indicates a capacitance of the adjustment sub-circuit 1, "MSM" indicates the non-adjustable capacitance of a Metal-Semiconductor-Metal (MSM), and the values of the MSM dark current and the MSM photocurrent are simulation results of the case where no adjustment sub-circuit 1 is applied to the active pixel sensor and the MSM capacitance is used as the storage capacitance.

In a second aspect, with reference to FIGS. 2 and 15, embodiments of the present disclosure further provide a flat panel detector, which includes a substrate 01 and a light conversion layer 11 disposed on the substrate 01 and including a plurality of active pixel sensors PX arranged in an array on the substrate 01. FIG. 15 shows an exemplary layer structure of the active pixel sensors PX on a substrate 01. Each active pixel sensor PX includes a reading circuit and a light sensing device Sg, and thus the reading circuits of the plurality of active pixel sensors PX constitute a TFT array 111 disposed on the substrate 01, and the light sensing devices Sg of the plurality of active pixel sensors PX constitute a light sensing device array 112 disposed on a side of the TFT array 111 away from the substrate 01. Furthermore, the flat panel detector further includes an X-ray conversion layer 12 on the side of the light conversion layer 11 away from the substrate 01, i.e., the X-ray conversion layer 12 is on the side of the plurality of active pixel sensors PX away from the substrate 01. The X-ray conversion layer 12 may be made of a scintillator, for example, which is a material capable of emitting light after absorbing high-energy particles or rays, and is usually processed into a crystal in application, namely, a scintillation crystal. The specific material of the scintillation crystal in the X-ray conversion layer 12 in the embodiment of the present disclosure is not limited, and may be, for example, cesium iodide, cadmium tungstate, barium fluoride, gadolinium oxysulfide (GOS), and the like. The scintillation crystal in the X-ray conversion layer 12 is subjected to an impact of high-energy particles of the X-rays attenuated after penetrating through a human body and converts the kinetic energy of the high-energy particles into light energy to emit light, that is, converts the X-rays into visible light. The visible light irradiates the light conversion layer 11, the light sensing devices of the active pixel sensors PX in the light conversion layer 11 can convert the visible light into electric charges, an electric signal corresponding to the electric charges are amplified into an output voltage by the reading circuit, and then the output voltage is read out and transmitted to the computer for image processing to form an X-ray image.

Further, the reading circuit of the active pixel sensor in the light conversion layer 11 may include at least one thin film transistor, and in particular, the film layers of the reading circuit of the active pixel sensor may include an active semiconductor layer, a gate insulating layer, a first conductive layer, a first insulating layer, a second conductive layer, and a planarization layer, which are sequentially stacked on the substrate 01 (e.g., sequentially disposed in a direction from the substrate 01 to the light sensing device Sg; alternatively, sequentially disposed in a direction from the light sensing device Sg to the substrate 01). The active semiconductor layer may include an active layer of each thin film transistor in the reading circuit, the first conductive layer may include a control electrode (i.e., a gate electrode) of each thin film transistor in the reading circuit, and the second conductive layer (e.g., a source-drain metal layer) may include a first electrode and a second electrode (i.e., a source electrode and a drain electrode) of each thin film transistor in the reading circuit. The first insulating layer is disposed on the substrate and covers the active semiconductor layer, the gate insulating layer, and the first conductive layer. The light sensing devices of the plurality of active pixel sensors are arranged on a side of the planarization layer away from the substrate.

Specifically, it is described by taking an example that the reading circuit of the active pixel sensor includes a follower transistor T1 and a read transistor T2 and the active pixel sensor may further include a reset transistor T3. It should be noted that a control electrode of the thin film transistor is a gate electrode, a first electrode of the thin film transistor is a source electrode, and a second electrode of the thin film transistor is a drain electrode. The flat panel detector may include a substrate 01, and may further include a buffer layer 02 disposed on the substrate 01. The flat panel detector may further include an active semiconductor layer disposed on a side of the buffer layer 02 away from the substrate 01, and the active semiconductor layer may include an active layer A1 of the follower transistor T1, an active layer A2 of the read transistor T2, and an active layer A3 of the reset transistor T3. The active semiconductor layer may include an oxide semiconductor, an organic semiconductor, amorphous silicon, polycrystalline silicon, or the like, for example, the oxide semiconductor includes a metal oxide semiconductor (e.g., Indium Gallium Zinc Oxide (IGZO)), and the polycrystalline silicon includes low-temperature polycrystalline silicon, high-temperature polycrystalline silicon, or the like. The active layer of each thin film transistor may include a channel region (a pattern filled with diagonal lines in the active layer of FIG. 15) and source-drain doped regions (a pattern filled with dots in the active layer of FIG. 15).

Further, the flat panel detector may further include a gate insulating layer 03, and the gate insulating layer 03 is disposed on a side of the active semiconductor layer away from the substrate 01. The material of the gate insulating layer 03 may include, for example, an inorganic insulating material such as silicon nitride, nitrogen oxide, or silicon oxynitride, an organic insulating material such as an organic resin, or other suitable materials, which are not limited herein.

Further, the flat panel detector may further include a first conductive layer disposed on a side of the gate insulating layer 03 away from the substrate 01, and the first conductive layer may include a control electrode G1 of the follower transistor T1, a control electrode G2 of the read transistor T2, and a control electrode G3 of the reset transistor T3.

Further, the flat panel detector may further include a first insulating layer 04 disposed on a side of the first conductive layer away from the substrate 01.

Further, the flat panel detector may further include a source-drain metal layer. The source-drain metal layer is disposed on a side of the first insulating layer 04 away from the substrate 01, and includes a first electrode S1 and a second electrode D1 of the follower transistor T1, a first electrode S2 and a second electrode D2 of the read transistor T2, and a first electrode S3 and a second electrode D3 of the reset transistor T3.

Further, the flat panel detector may further include a planarization layer 05 disposed on a side of the source-drain metal layer away from the substrate 01.

Further, a light sensing device Sg may be disposed on a side of the planarization layer 05 away from the substrate 01, and the light sensing device Sg may include a seventh electrode Sg1, a photoelectric conversion layer Sg2 and an eighth electrode Sg3 which are sequentially disposed on a side of the planarization layer 05 away from the substrate 01, where one of the seventh electrode Sg1 and the eighth electrode Sg3 is a cathode and the other is an anode. The seventh electrode Sg1 (of which only a portion coupled to the second electrode D3 of the reset transistor T3 is exemplarily shown in the drawing) is coupled to the control electrode G1 of the follower transistor T1 and the second electrode D3 of the reset transistor T3 through a via hole in the planarization layer 05. The photoelectric conversion layer Sg2 at least contains a photoelectric conversion material, and if the photoelectric conversion layer Sg2 is used for detecting ultraviolet light, a material capable of performing photoelectric conversion on the ultraviolet light is selected, and in specific implementation, the material can be selected according to actual requirements.

Further, the flat panel detector may further include a protection layer 06 disposed on a side of the light sensing device Sg away from the substrate 01 and configured to protect the light sensing device Sg.

In some embodiments, at least one of the buffer layer 02, the planarization layer 05, and the protection layer 06 may be made of a material consistent with that of the gate insulating layer 03, for example, an inorganic insulating material such as silicon nitride, nitrogen oxide, and silicon oxynitride, an organic insulating material such as an organic resin, or other suitable materials, which are not limited herein.

It is understood that in the present embodiment, the reading circuit of the active pixel sensor includes the adjustment sub-circuit 1, and the adjustment sub-circuit 1 may include various types of circuit structures, and the layer structure of the flat panel detector to which the active pixel sensor is applied may be changed accordingly according to the circuit structures, which will be described in detail below.

In some examples, with reference to FIGS. 3 and 15, when the active pixel sensor shown in FIG. 3 is applied to a flat panel detector (i.e., the adjustment sub-circuit 1 of the active pixel sensor includes the first capacitor C1, the second capacitor C2 and the switching transistor Tk), the active layer Ak of the switching transistor Tk is arranged in the same layer and made of the same material as the active layers of other transistors (e.g., the active layer A1 of the follower transistor T1), that is, the active semiconductor layer further includes the active layer Ak of the switching transistor Tk; the control electrode Gk of the switching transistor Tk is arranged in the same layer and made of the same material as the control electrodes of other transistors (e.g., the control electrode G1 of the follower transistor T1), that is, the first conductive layer further includes the control electrode Gk of the switching transistor Tk; the first and second electrodes Sk and Dk of the switching transistor Tk are arranged in the same layer and made of the same material as the first and second electrodes of other transistors (e.g., the first and second electrodes S1 and D1 of the follower transistor T1), that is, the second conductive layer further includes the first and second electrodes Sk and Dk of the switching transistor Tk. The first capacitor C1 and the second capacitor C2 are arranged in the same layer and each is composed of two plates, a first plate C11 of the first capacitor C1, a first plate C21 of the second capacitor C2 are arranged in the same layer and made of the same material as the first electrodes of transistors (e.g., the first electrode S1 of the follower transistor T1), that is, the second conductive layer further includes the first plate C11 of the first capacitor C1 and the first plate C21 of the second capacitor C2; a second plate C12 of the first capacitor C1 and a second plate C22 of the second capacitor C2 are arranged in the same layer and made of the same material as the control electrodes of transistors (e.g., the control electrode G1 of the follower transistor T1), that is, the first conductive layer further includes the second plate C12 of the first capacitor C1 and the second plate C22 of the second capacitor C2. The first plate C11 and the second plate C12 of the first capacitor C1 may serve as the first electrode and the second electrode of the first capacitor C1 of FIG. 3, and the first plate C21 and the second plate C22 of the second capacitor C2 may serve as the first electrode and the second electrode of the second capacitor C2 of FIG. 3.

In some examples, referring to FIG. 16 along with FIG. 6, when the active pixel sensor shown in FIG. 6 is applied to a flat panel detector (i.e., the adjustment sub-circuit 1 of the active pixel sensor includes the voltage-controlled liquid crystal capacitor C3), the voltage-controlled liquid crystal capacitor C3 includes a first electrode C31, a liquid crystal layer C33, and second and third electrodes C32a and C32b which are arranged side by side and spaced apart from each other, and further includes a sealant which is arranged between the first electrode C31 and the electrodes C32a and C32b and is located at an edge region of the first electrode C31 to seal the liquid crystal layer C33 between the first electrode C31 and the electrodes C32a and C32b. The second electrode C32a and the third electrode C32b of the voltage-controlled liquid crystal capacitor C3 are arranged in the same layer and made of the same material as the control electrodes of transistors (e.g., the control electrode G1 of the follower transistor T1), that is, the first conductive layer further includes the second electrode C32a and the third electrode C32b of the voltage-controlled liquid crystal capacitor C3. The first electrode C31 of the voltage-controlled liquid crystal capacitor C3 is arranged in the same layer and made of the same material as the first electrodes of transistors (e.g., the first electrode S1 of the follower transistor T1), that is, the second conductive layer further includes the first electrode C31 of the voltage-controlled liquid crystal capacitor C3. In some embodiments, referring to FIGS. 6 and 16 together, the first electrode C31 of the voltage-controlled liquid crystal capacitor may be coupled to the floating diffusion node FD, the second electrode C32a of the voltage-controlled liquid crystal capacitor may be coupled to the second power supply voltage terminal, and the third electrode C32b of the voltage-controlled liquid crystal capacitor may be coupled to the first control signal terminal. FIG. 16 illustrates a case where the electrodes C32a and C32b, the liquid crystal layer C33, and the first electrode C31 are disposed in an order sequentially away from the substrate 01, but the present disclosure is not limited thereto. In some embodiments, the first electrode C31, the liquid crystal layer C33, and the electrodes C32a, C32b may be disposed on the substrate 01 in an order sequentially away from the substrate 01, and in this case, the first electrode C31 is arranged in the same layer and made of the same material as the control electrodes of transistors (e.g., the gate electrode G1 of the follower transistor T1), and the electrodes C32a, C32b are arranged in the same layer and made of the same material as the first electrodes of transistors (e.g., the first electrode S1 of the follower transistor T1).

In some examples, the active pixel sensor shown in FIG. 7 may be applied to a flat panel detector, that is, the adjustment sub-circuit 1 of the active pixel sensor includes a varactor diode, which may include an NMOS transistor, a PMOS transistor, a PN diode, or a PIN diode, etc.

Figure 17:
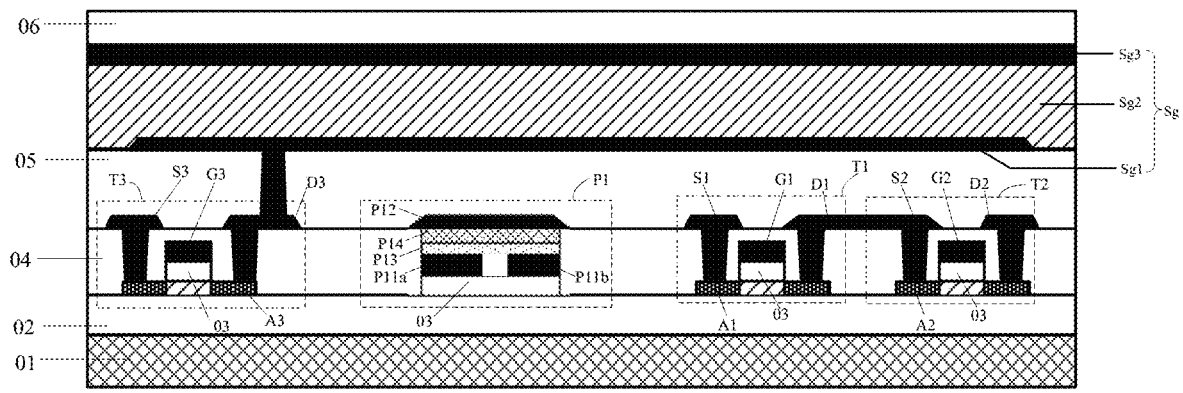
FIG. 17 is a cross-sectional view illustrating a layer structure of an active pixel sensor according to an embodiment of the present disclosure.

In some examples, referring to FIGS. 7 and 17, if the varactor diode P1 in FIG. 7 is a PN diode, the PN diode P1 (see FIG. 17) includes electrodes P11a and P11b, an N-type semiconductor layer P13, a P-type semiconductor layer P14, and a first electrode P12, which are sequentially disposed in a direction from the substrate 01 to the planarization layer 05. The stack of the N-type semiconductor layer P13 and the P-type semiconductor layer P14 may be referred to as a semiconductor structure. The second electrode P11a and the third electrode P11b are arranged side by side and spaced apart from each other at a side of the semiconductor structure away from the first electrode P12. The first electrode P12 may be the first electrode of the varactor diode, the second electrode P11a may be the second electrode of the varactor diode, and the third electrode P11b may be the control electrode of the varactor diode. By the voltage applied to the third electrode P11b (for receiving the first control signal CON1), the capacitance of the PN diode can be changed to adjust the conversion gain from the amount of light sensed by the light sensing device Sg to the potential at the floating diffusion node FD. The second electrode P11a and the third electrode P11b are arranged in the same layer and made of the same material as the control electrodes of transistors (for example, the control electrode G1 of the follower transistor T1), that is, the first conductive layer further includes the second electrode P11a and the third electrode P11b, and the first electrode P12 is arranged in the same layer and made of the same material as the first electrodes of transistors (e.g., the first electrode S1 of the follower transistor T1), that is, the second conductive layer further includes the first electrode P12.

Figure 18:
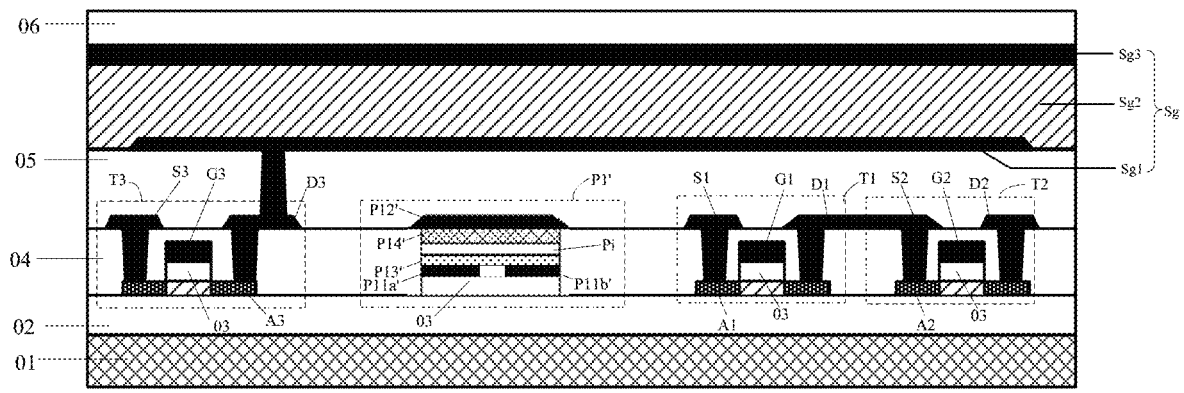
FIG. 18 is a cross-sectional view illustrating a layer structure of an active pixel sensor according to an embodiment of the present disclosure.

Referring to FIGS. 7 and 18, if the varactor diode P1 in FIG. 7 is a PIN diode (P1' in FIG. 18), the PIN diode P1' includes electrodes P11a' and P11b', an N-type semiconductor layer P13', an intrinsic layer Pi, a P-type semiconductor layer P14', and a first electrode P12' sequentially disposed in a direction from the substrate 01 to the planarization layer 05. The stack of the N-type semiconductor layer P13', the intrinsic layer Pi, and the P-type semiconductor layer P14' may be referred to as a semiconductor structure. The second electrode P11a' and the third electrode P11b' are arranged side by side and spaced apart from each other on a side of the semiconductor structure away from the first electrode P12'. The first electrode P12' is the first electrode of the varactor diode, the second electrode P11a' is the second electrode of the varactor diode, and the third electrode P11b' may be the control electrode of the varactor diode. By the voltage applied to the third electrode P11b' (for receiving the first control signal CON1), the capacitance of the PIN diode can be changed to adjust the conversion gain from the amount of light sensed by the light sensing device Sg to the potential at the floating diffusion node FD. The second electrode P11a' and the third electrode P11b' are arranged in the same layer and made of the same material as the control electrodes of transistors (for example, the control electrode G1 of the follower transistor T1), that is, the first conductive layer further includes the second electrode P11a' and the third electrode P11b', and the first electrode P12' is arranged in the same layer and made of the same material as the first electrodes of transistors (e.g., the first electrode S1 of the follower transistor T1), that is, the second conductive layer further includes the first electrode P12'.

Figure 19:
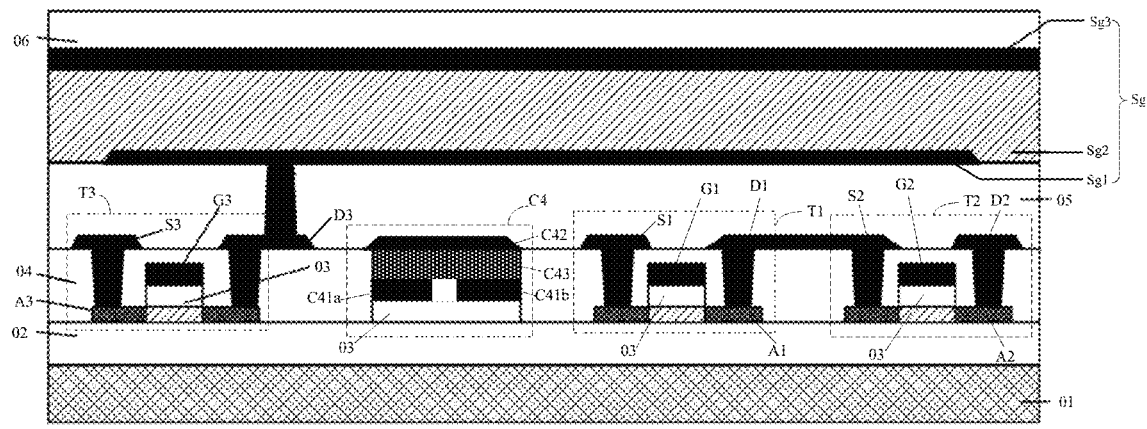
FIG. 19 is a cross-sectional view illustrating a layer structure of an active pixel sensor according to an embodiment of the present disclosure.

In some examples, referring to FIGS. 8 and 19, when the active pixel sensor shown in FIG. 8 is applied to a flat panel detector (i.e., the adjustment sub-circuit 1 of the active pixel sensor is an AMNR), the AMNR C4 includes amorphous metal plates C41a and C41b, a second insulating layer C43, and a first amorphous metal plate C42, which are sequentially disposed in a direction from the substrate 01 to the planarization layer 05. The thickness of the second insulating layer C43 is in a range of 10 nm to 20 nm, and the second amorphous metal plate C41a, the third amorphous metal plate C41b and the first amorphous metal plate C42 are made of amorphous metal, so that the roughness is low, the whole volume of the AMNR is reduced to facilitate integration. The second amorphous metal plate C41a and the third amorphous metal plate C41b are arranged side by side and spaced apart from each other on a side of the second insulating layer C43 away from the first amorphous metal plate C42. The second amorphous metal plate C41a and the third amorphous metal plate C41b are arranged in the same layer and made of the same material as the control electrodes of transistors (e.g., the control electrode G1 of the follower transistor T1), that is, the first conductive layer further includes the second amorphous metal plate C41a and the third amorphous metal plate C41b; the first amorphous metal plate C42 is arranged in the same layer and made of the same material as the first electrodes of transistors (e.g., the first electrode S1 of the follower transistor T1), that is, the second conductive layer further includes the first amorphous metal plate C42. The first, second and third amorphous metal plates C42, C41a and C41b may serve as the first electrode coupled to the floating diffusion node FD, the second electrode coupled to the second power supply voltage terminal, and the third electrode coupled to the first control signal terminal of the AMNR C4 in FIG. 8, respectively.

Figure 20:
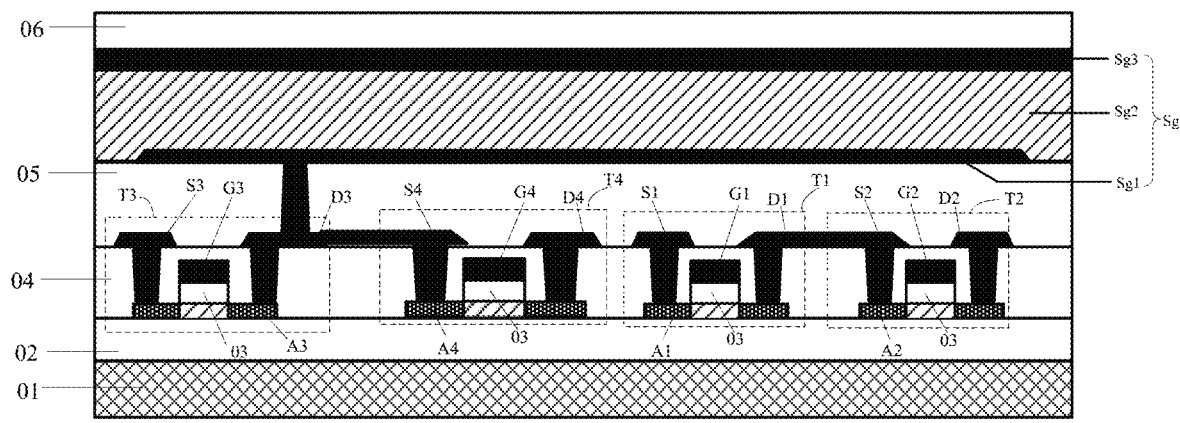
FIG. 20 is a cross-sectional view illustrating a layer structure of an active pixel sensor according to an embodiment of the present disclosure.

In some examples, referring to FIGS. 10 and 20, when the active pixel sensor shown in FIG. 10 is applied to a flat panel detector (i.e., the adjustment sub-circuit 1 of the active pixel sensor includes an adjustment transistor T4), the active layer A4 of the adjustment transistor T4 is arranged in the same layer and made of the material as the active layers of other transistors (e.g., the active layer A1 of the follower transistor T1), that is, the active semiconductor layer further includes the active layer A4 of the adjustment transistor T4; the control electrode G4 of the adjustment transistor T4 is arranged in the same layer and made of the same material as the control electrodes of other transistors (e.g., the control electrode G1 of the follower transistor T1), that is, the first conductive layer further includes the control electrode G4 of the adjustment transistor T4; the first and second electrodes S4, D4 of the adjustment transistor T4 are arranged in the same layer and made of the same material as the first and second electrodes of other transistors (e.g., the first and second electrodes S1 and D1 of the follower transistor T1), that is, the second conductive layer further includes the first and second electrodes S4 and D4 of the adjustment transistor T4.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. An active pixel sensor, comprising:
   a light sensing device configured to convert light sensed by the light sensing device into charges and supply the charges to a floating diffusion node;
   an amplification sub-circuit having an input terminal coupled to the floating diffusion node, a bias terminal coupled to a first power supply voltage terminal for supplying a first power supply voltage, and an output terminal, and configured to amplify a signal according to a potential at the floating diffusion node and output the amplified signal through the output terminal;
   an adjustment sub-circuit comprising an amorphous metal nonlinear resistor (AMNR) that has a first electrode coupled to the floating diffusion node, an insulating layer on a side of the first electrode, and second and third electrodes arranged side by side and spaced apart from each other on a side of the insulating layer away from the first electrode and coupled to the second power supply voltage terminal and the first control signal terminal, respectively, and is configured to change a capacitance value between the first electrode and the second electrode in response to a first control signal provided by the first control signal terminal, such that the conversion gain from the amount of the light sensed by the light sensing device to the potential at the floating diffusion node is changed; and
   a read sub-circuit having a control terminal coupled to a scan line, an input terminal coupled to the output terminal of the amplification sub-circuit, and an output terminal, and configured to transmit a voltage of the input terminal of the read sub-circuit to the output terminal of the read sub-circuit according to a scan signal provided by the scan line.

2. The active pixel sensor of claim 1, wherein the amplification sub-circuit comprises a follower transistor having a control electrode coupled to the floating diffusion node, a first electrode coupled to the first power supply voltage terminal, and a second electrode coupled to the output terminal of the amplification sub-circuit, and the read sub-circuit comprises a read transistor having a control electrode coupled to the scan line, a first electrode coupled to the output terminal of the amplification sub-circuit, and a second electrode coupled to the output terminal of the read sub-circuit.

3. The active pixel sensor of claim 1, further comprising: a reset transistor having a control electrode coupled to a reset signal terminal for providing a reset control signal, a first electrode coupled to an initialization signal terminal for providing an initialization signal, and a second electrode coupled to the floating diffusion node.

4. A flat panel detector, comprising a plurality of active pixel sensors, each of the active pixel sensors being the active pixel sensor of claim 1.

5. The flat panel detector of claim 4, further comprising:
a substrate on which the plurality of active pixel sensors are arranged in an array; and
an X-ray conversion layer on a side of the plurality of active pixel sensors away from the substrate.

6. The flat panel detector of claim 5, wherein the amplification sub-circuit comprises a follower transistor having a control electrode coupled to the floating diffusion node, a first electrode coupled to the first power supply voltage terminal, and a second electrode coupled to the output terminal of the amplification sub-circuit, and the read sub-circuit comprises a read transistor having a control electrode coupled to the scan line, a first electrode coupled to the output terminal of the amplification sub-circuit, and a second electrode coupled to the output terminal of the read sub-circuit, the flat panel detector further comprises:
an active semiconductor layer, a gate insulating layer and a first conductive layer sequentially stacked on the substrate, the active semiconductor layer comprising active layers of the follower transistor and the read transistor of each active pixel sensor, the first conductive layer comprising control electrodes of the follower transistor and the read transistor, a first insulating layer on the substrate and covering the active semiconductor layer, the gate insulating layer, and the first conductive layer, a second conductive layer on a side of the first insulating layer away from the substrate and comprising first and second electrodes of the follower transistor and the read transistor, and a planarization layer on a side of the second conductive layer away from the substrate, and the light sensing devices of the plurality of active pixel sensors are on a side of the planarization layer away from the substrate.

7. The flat panel detector of claim 6, wherein
the first amorphous metal plate and the control electrode of the follower transistor are in a same layer and are made of a same material, and the second and third amorphous metal plates and the first electrode of the follower transistor are in a same layer and made of a same material.

\* \* \* \* \*